(12) United States Patent
Sudo et al.

(10) Patent No.: US 9,947,681 B2
(45) Date of Patent: Apr. 17, 2018

(54) SEMICONDUCTOR DEVICE AND METHOD FOR MANUFACTURING SAME

(71) Applicant: TOSHIBA MEMORY CORPORATION, Minato-ku (JP)

(72) Inventors: Gaku Sudo, Yokkaichi (JP); Masanobu Baba, Yokkaichi (JP); Megumi Ishiduki, Yokkaichi (JP); Tadashi Iguchi, Yokkaichi (JP); Murato Kawai, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/258,774

(22) Filed: Sep. 7, 2016

(65) Prior Publication Data

US 2017/0213840 A1    Jul. 27, 2017

Related U.S. Application Data

(60) Provisional application No. 62/281,576, filed on Jan. 21, 2016.

(51) Int. Cl.
| | | |
|---|---|---|
| *H01L 27/115* | (2017.01) | |
| *H01L 27/11568* | (2017.01) | |
| *H01L 21/28* | (2006.01) | |

(52) U.S. Cl.
CPC .. *H01L 27/11568* (2013.01); *H01L 21/28282* (2013.01)

(58) Field of Classification Search
CPC ...................... H01L 27/11568; H10L 21/28282
See application file for complete search history.

(56) References Cited

U.S. PATENT DOCUMENTS

| | | | |
|---|---|---|---|
| 8,188,530 B2 | 5/2012 | Tanaka et al. | |
| 8,564,050 B2 | 10/2013 | Park et al. | |
| 8,581,323 B2 | 11/2013 | Uenaka et al. | |
| 8,692,312 B2 | 4/2014 | Fukuzumi et al. | |
| 2003/0209767 A1 | 11/2003 | Takahashi et al. | |

(Continued)

FOREIGN PATENT DOCUMENTS

| | | |
|---|---|---|
| JP | 2003-332469 | 11/2003 |
| JP | 2009-170661 | 7/2009 |

(Continued)

*Primary Examiner* — Long Pham
(74) *Attorney, Agent, or Firm* — Oblon, McClelland, Maier & Neustadt, L.L.P.

(57) ABSTRACT

According to one embodiment, a method for manufacturing a semiconductor device is disclosed. The method includes forming a stacked body alternately stacked with a plurality of members and a plurality of intermediate bodies having materials different from materials of the plurality of members, processing an end portion of at least two layers of the plurality of members sequentially in a stacking direction of the stacked body, and forming a step-wise step stacked with the plurality of members and the plurality of intermediate bodies, forming a plurality of side wall films contacting the step and making the end portion of the plurality of members in a step-wise. The making the end portion of the plurality of members in a step-wise includes retreating a portion of the plurality of members, the portion separated from the plurality of side wall films and exposed from the stacked body.

6 Claims, 32 Drawing Sheets

(56) References Cited

U.S. PATENT DOCUMENTS

| | | |
|---|---|---|
| 2009/0267135 A1* | 10/2009 | Tanaka ................. H01L 27/115 |
| | | 257/324 |
| 2011/0169067 A1 | 7/2011 | Ernst et al. |
| 2011/0233644 A1 | 9/2011 | Fukuzumi et al. |
| 2013/0234232 A1 | 9/2013 | Yahashi |
| 2013/0334591 A1 | 12/2013 | Matsuda |
| 2014/0001544 A1 | 1/2014 | Sato et al. |
| 2014/0241063 A1 | 8/2014 | Maeda |
| 2014/0284693 A1 | 9/2014 | Sato et al. |
| 2015/0249094 A1 | 9/2015 | Sato et al. |

FOREIGN PATENT DOCUMENTS

| | | |
|---|---|---|
| JP | 2011-9328 | 1/2011 |
| JP | 2011-142276 | 7/2011 |
| JP | 2011-204713 | 10/2011 |
| JP | 2011-527515 | 10/2011 |
| JP | 2012-109571 | 6/2012 |
| JP | 2013-42179 | 2/2013 |
| JP | 2013-58683 | 3/2013 |
| JP | 2013-187200 | 9/2013 |
| JP | 2014-11389 | 1/2014 |
| JP | 2014-167838 | 9/2014 |
| JP | 2014-183304 | 9/2014 |

* cited by examiner

SEMICONDUCTOR DEVICE AND METHOD FOR MANUFACTURING SAME

CROSS-REFERENCE TO RELATED APPLICATIONS

This application is based upon and claims the benefit of priority from U.S. Provisional Patent Application 62/281,576 filed on Jan. 21, 2016; the entire contents of which are incorporated herein by reference.

FIELD

Embodiments described herein relate to a semiconductor device and a method for manufacturing the same.

BACKGROUND

A 3-dimensional structure memory device is proposed, where a memory hole is formed in a stacked body formed by stacking a plurality of electrode layers, and a charge storage film and a semiconductor film are provided to extend along a stacking direction in the memory hole. The memory device includes a plurality of memory cells connected in series between a drain side selection transistor and a source side selection transistor. The electrode layers of the stacked body are gate electrodes of the drain side selection transistor, the source side selection transistor and the memory cell. A step structure section with the stacked body processed in a step-wise is placed outside the memory cell array disposed with the memory cell. A memory peripheral circuit is electrically connected to the drain side selection transistor, the source side selection transistor, and the memory cell via the step structure section. Increase of stacking number in the stacked body may increase the number of processes in forming the step structure section.

DETAILED DESCRIPTION

Figure 1:
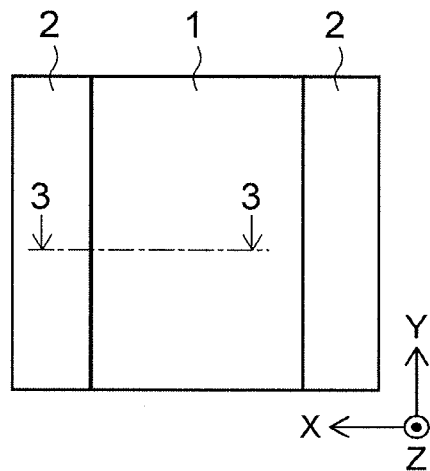
FIG. 1 is a schematic plane view showing a layout of a semiconductor device of a first embodiment.

According to one embodiment, a method for manufacturing a semiconductor device is disclosed. The method includes forming a stacked body alternately stacked with a plurality of members and a plurality of intermediate bodies having materials different from materials of the plurality of members, processing an end portion of at least two layers of the plurality of members sequentially in a stacking direction of the stacked body, and forming a step-wise step stacked with the plurality of members and the plurality of intermediate bodies, forming a plurality of side wall films contacting the step and making the end portion of the plurality of members in a step-wise. The making the end portion of the plurality of members in a step-wise includes retreating a portion of the plurality of members, the portion being separated from the plurality of side wall films and being exposed from the stacked body.

Various embodiments will be described hereinafter with reference to the accompanying drawings. Like elements in the drawings are labeled with like reference numerals. Semiconductor devices of embodiments are semiconductor memory devices including memory cell array.

First Embodiment: Semiconductor Device

Figure 2:
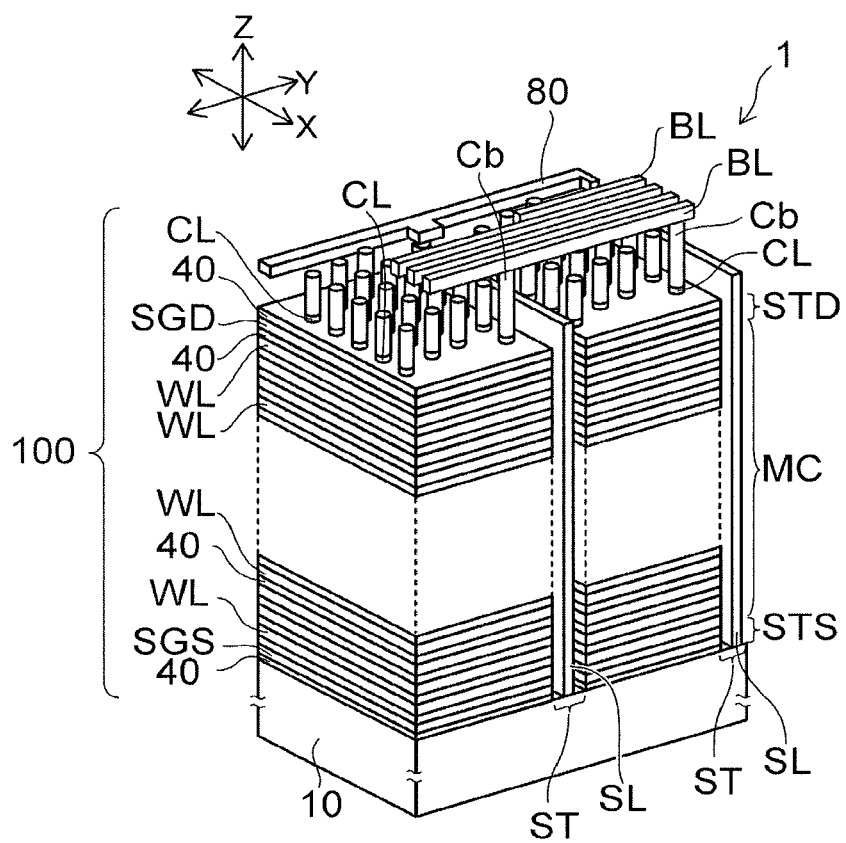
FIG. 2 is a schematic perspective view of a memory array of the first embodiment.

FIG. 1 is a schematic plane view showing a planar layout of a semiconductor device of a first embodiment. FIG. 2 is a schematic perspective view of a memory cell array 1 of the first embodiment.

In FIG. 1 and FIG. 2, two directions parallel to a major surface of a substrate 10 and orthogonal each other are taken as an X-direction (first direction) and a Y-direction (second direction), and a direction orthogonal to both of the X-direction and the Y-direction is taken as a Z-direction (a stacking direction 100 of a stacked body 100).

As shown in FIG. 1 and FIG. 2, the semiconductor device of the first embodiment includes the memory cell array 1 and a step structure section 2. The memory cell array 1 and the step structure section 2 are, for example, provided on the major surface of the substrate 10. The step structure section 2 is provided outside the memory cell array 1. The substrate 10 is, for example, a semiconductor substrate. The semiconductor substrate includes, for example, silicon. Conductivity type of the substrate 10 is, for example, a p-type.

The memory cell array 1 includes the stacked body 100, a plurality of columnar portions CL, and a plurality of slits ST. The stacked body 100 is provided on the major surface of the substrate 10. The stacked body 100 includes a plurality of electrode layers (SGD, WL, SGS) stacked via an insulator 40. The stacked body 100 is provided integrally from the memory cell array 1 to the step structure section 2.

The electrode layers (SGD, WL, SGS) are stacked separately via the insulator 40. The electrode layers (SGD, WL, SGS) include a conductive material. The conductive material includes, for example, tungsten. The insulator 40 may be an insulating material such as a silicon oxide film, and may include an air gap. The stacking number of the electrode layers (SGD, WL, SGS) is arbitrary.

The electrode layer SGS is a source side selection gate. The electrode layer SGD is a drain side selection gate. The electrode layer WL is a word line. The source side selection gate SGS is provided on the major surface of the substrate 10 via the insulator 40. The plurality of word lines WL is provided on the source side selection gate SGS via the insulator 40. The drain side selection gate SGD is provided on the upper most layer word line WL via the insulator 40.

A drain side selection transistor STD assumes at least one of the drain side selection gates SGD to be a gate electrode. A source side selection transistor STS assumes at least one of the source side selection gates SGS to be a gate electrode. A plurality of memory cells MC is connected in series between the drain side selection transistor STD and the source side selection transistor STS. The memory cell MC assumes one of the word lines WL to be a gate electrode.

The slits ST are provided in the stacked body 100. The slits ST extend along the stacking direction (Z-direction) of the stacked body 100 and the major surface direction (X-direction) of the substrate 10. Although not shown in FIG. 1 and FIG. 2, the slits ST extend from the memory cell array 1 toward the step structure section 2. The slits ST separate the stacked body 100 in plurality in the Y-direction. Each region separated by the slits ST is called as "block".

The source line SL is provided in the slit ST. The source line SL includes the conductive material. The conductive material includes, for example, at least one of tungsten and titanium. The source line SL may include, for example, a stacked body of titanium and a titanium nitride film. The source line SL is electrically connected to the substrate 10.

An upper portion 80 is disposed above the source line SL. The upper portion 80 extends in the Y-direction. The upper portion 80 is electrically connected to the plurality of source lines SL arranged along the Y-direction. The upper portion 80 is electrically connected to a peripheral circuit not shown.

The columnar portion CL is provided in the stacked body 100 separated by the slits ST. The columnar portion CL extends in the stacking direction (Z-direction) of the stacked body 100. The columnar portion CL is formed, for example, cylindrically or elliptic cylindrically. The columnar portion CL is disposed in the memory cell array 1, for example, in a staggered lattice configuration or a square lattice configuration. The drain side selection transistor STD, the source side selection transistor STS and the memory cell MC are disposed in the columnar portion CL.

A plurality of bit lines BL is provided above the columnar portion CL. The plurality of bit lines BL extends in the Y-direction. An upper end of the columnar portion CL is electrically connected to one of the bit lines via a contact portion Cb. One bit line BL is electrically connected to the columnar portion CL selected from the each block one by one. A lower end of the columnar portion CL is electrically connected to the source line SL via the substrate 10.

Figure 3:
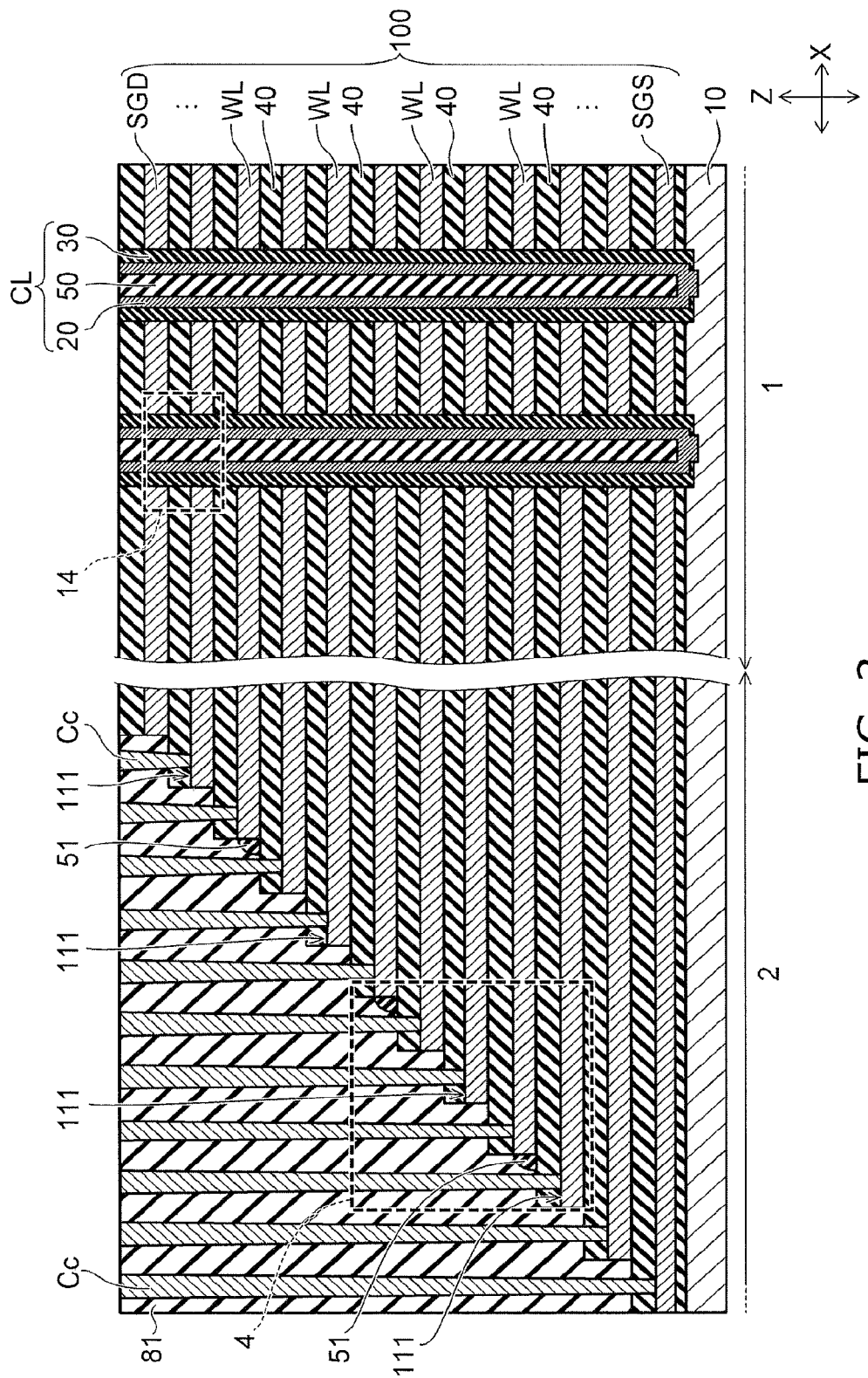
FIG. 3 is a schematic cross-sectional view of the semiconductor device of the first embodiment.

FIG. 3 is a schematic cross-sectional view along a 3-3 line in FIG. 1. In FIG. 3, a structure above the stacked body 100 is omitted.

As shown in FIG. 3, the columnar portion CL includes a memory film 30, a semiconductor body 20, and a core layer 50. The memory film 30, the semiconductor body 20, and the core layer 50 extend along the stacking direction (Z-direction) of the stacked body 100. The memory film 30 is provided to contact the stacked body 100. The shape of the memory film 30 is, for example, tubular. The semiconductor body 20 is provided on the memory film 30. The semiconductor body 20 includes, for example, silicon. Silicon is, for example, polysilicon which is crystallized from amorphous silicon. The semiconductor body 20 is electrically connected to the substrate 10. The core layer 50 is provided on the semiconductor body 20. The core layer 50 is insulative. The core layer 50 includes, for example, a silicon oxide. The shape of the core layer 50 is, for example, columnar. The detail in the columnar portion CL is described later.

End portions of the electrode layers (SGD, WL, SGS) are disposed in the step structure section 2. The end portions of the electrode layers (SGD, WL, SGS) are stacked while being shifted in a step-wise in the step structure section 2. Thereby, the interconnect is electrically connected to the respective electrode layers (SGD, WL, SGS). A portion including the end portion of the electrode layers (SGD, WL, SGS) and being electrically connected to the interconnect is referred to as a "terrace 111". That is, the terrace 111 is a region where the respective electrode layers (SGD, WL, SGS) contact the upper interconnect.

An insulating layer 81 is integrally provided on the respective terraces 111 via the insulator 40. The insulating layer 81 includes, for example, a silicon oxide. A plurality of contact portions Cc extending in the Z-direction is provided in the insulating layer 81. The each contact portion Cc is electrically connected to one layer of the electrode layers (SGD, WL, SGS) of the plurality of electrode layers (SGD, WL, SGS), and is separated from other electrode layers (SGD, WL, SGS). On some terraces 111 of the plurality of terraces 111, a side wall film 51 is provided via the insulator 40.

Figure 4A:
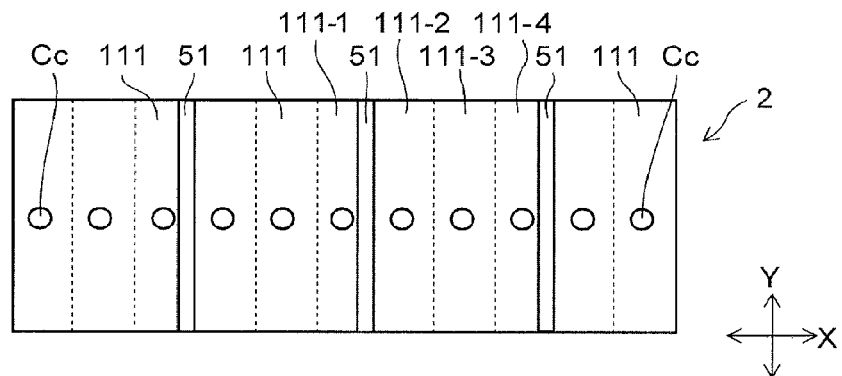
FIG. 4A is a schematic plan view of the semiconductor device of the first embodiment.

FIG. 4A is a schematic plan view of the step structure section 2 in FIG. 3. In FIG. 4A, only the terrace 111, the contact portion Cc and the side wall film 51 are shown. The broken line in the drawing shows a boundary between the respective terraces.

As shown in a plan view of FIG. 4A, the plurality of side wall films 51 is disposed across the two adjacent terraces 111. For example, two of a second terrace 111-2 and a third terrace 111-3 without the side wall film 51 are disposed between the side wall film 51 of a first terrace 111-1 and the side wall film 51 of a fourth terrace 111-4. The side wall films 51 include, for example, amorphous silicon or a silicon nitride. The side wall films 51 may include, for example, a silicon oxide with a different composition from the insulator 40. For example, when the side wall film 51 is insulative, the side wall film 51 may contact the contact portions Cc.

Figure 4B:
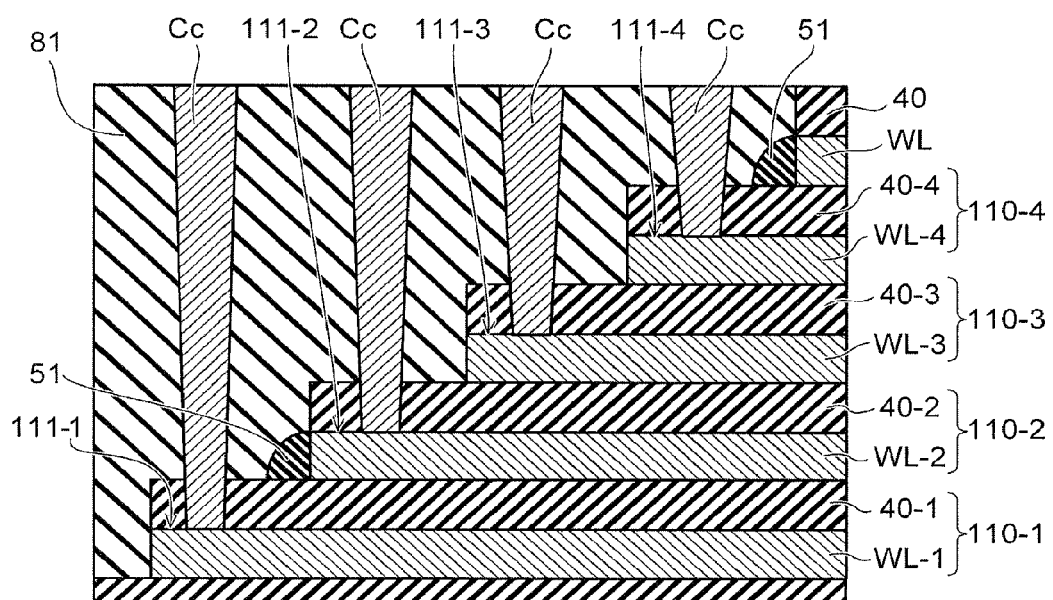
FIG. 4B is an enlarged schematic cross-sectional view of a broken line frame 4 in FIG. 3.

FIG. 4B is an enlarged schematic cross-sectional view of a broken line frame 4 in FIG. 3.

As shown in FIG. 4B, the stacked body 100 includes a first structure body 110-1 to a fourth structure body 110-4.

The respective structure bodies 110-1 to 110-4 include one layer of a first electrode layer WL-1 to a fourth electrode layer WL-4, and one layer of a first insulator 40-1 to a fourth insulator 40-4 provided thereon, respectively. The second structure body 110-2 is provided on the first structure body 110-1 except the first terrace 111-1. The third structure body 110-3 is provided on the second structure body 110-2 except the second terrace 111-2. The fourth structure body 110-4 is provided on the third structure body 110-3 except the third terrace 111-3.

The side wall film 51 is provided on the first terrace 111-1 via the first insulator 40-1. The side wall film 51 contacts an upper surface of the first insulator 40-1 and a side surface of the second electrode layer WL-2. The side wall film 51 may contact, for example, a side surface of the second insulator 40-2.

The side wall film 51 is provided on the fourth terrace 111-4 via the fourth insulator 40-4. The side wall film 51 is contacts an upper surface of the fourth insulator 40-4 and a side surface of the electrode layer WL stacked thereon. The side wall film 51 on the fourth terrace 111-4 is separated from the side wall film 51 on the first terrace 111-1, the first structure body 110-1 and the second structure body 110-2.

The side wall film 51 is not provided on the second terrace 111-2 and the third terrace 111-3, and the upper surface of the second insulator 40-2 and the upper surface of the third insulator 40-3 are separated from the side wall film 51. The side surface of the third structure body 110-3 is separated from the side wall film 51.

In the first embodiment, the side wall film 51 is provided on the first terrace 111 across the two adjacent terraces 111. This side wall film 51 is used as an etching protection film of the replacement member in a process of processing the replacement member into a step-wise described later. For this reason, the replacement member not covered with the side wall film 51 can be retreated selectively. Thereby, compared with a method of forming the step structure by processing the replacement member one layer by one layer, the number of processes can be reduced. The detail of the process will be described.

Although in the first embodiment, the side wall film 51 is disposed across the two adjacent terraces 111, the number of separated terraces may be arbitrary if more than 1, it is much the same for the following embodiments.

First Embodiment: Manufacturing Method

Next, one example of a method for manufacturing a semiconductor device according to the first embodiment will be described.

FIG. 5A to FIG. 12 are schematic cross-sectional views showing the method for manufacturing the semiconductor device of the first embodiment.

<Forming Stacked Body 100>

Figure 5A:
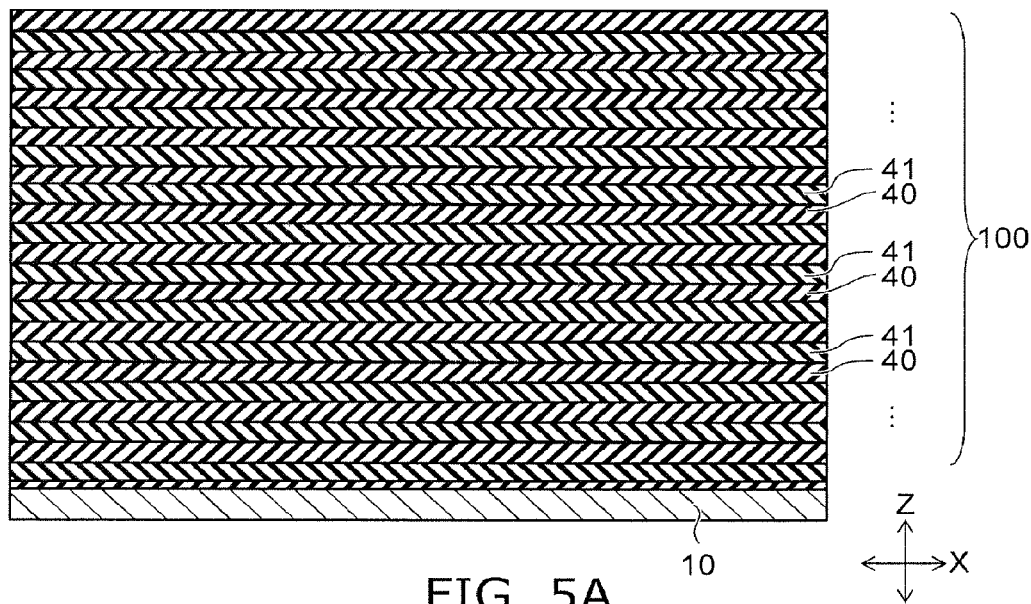
FIG. 5A to FIG. 12 are schematic views showing a method for manufacturing the semiconductor device of the first embodiment.

As shown in FIG. 5A, the stacked body 100 is formed on the substrate 10. The stacked body 100 is in a state where the replacement member 41 and the insulator 40 (intermediate body) are alternately stacked. The replacement member 41 is a member to be replaced by the electrode layers (SGD, WL, SGS) later. The material of the replacement member 41 is selected from materials that can take an etching selection ratio to the insulator 40. For example, when a silicon oxide is selected as the insulator 40, a silicon nitride is selected for the replacement member 41.

<Forming Step 211 in a Step-Wise (Step Forming Process)>

Figure 5B:
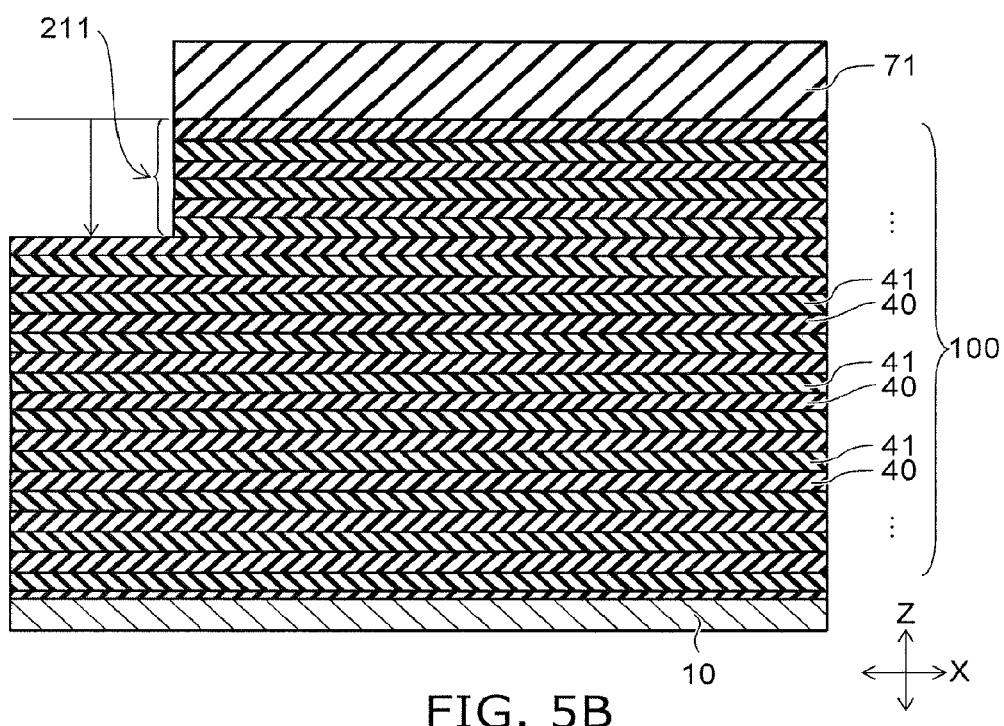

Next, as shown in FIG. 5B, a portion of the stacked body 100 is retreated. An arrow in the drawing shows a retreated portion of the stacked body 100. Thereby, the step 211 is formed. As a method for retreating the stacked body 100, for example, an anisotropic etching such as the RIE method (Reactive Ion Etching) or the like based on a mask as a photoresist 71 formed on the stacked body 100 is used. In the first embodiment, portions (end portions) of 3 layers of the replacement members 41 and portions of 3 layers of the insulators 40 are removed and the step 211 is formed. Side surfaces of the 3 layers of the replacement members 41 and side surfaces of the 3 layers of the insulators 40 are exposed from the step 211.

Figure 6A:
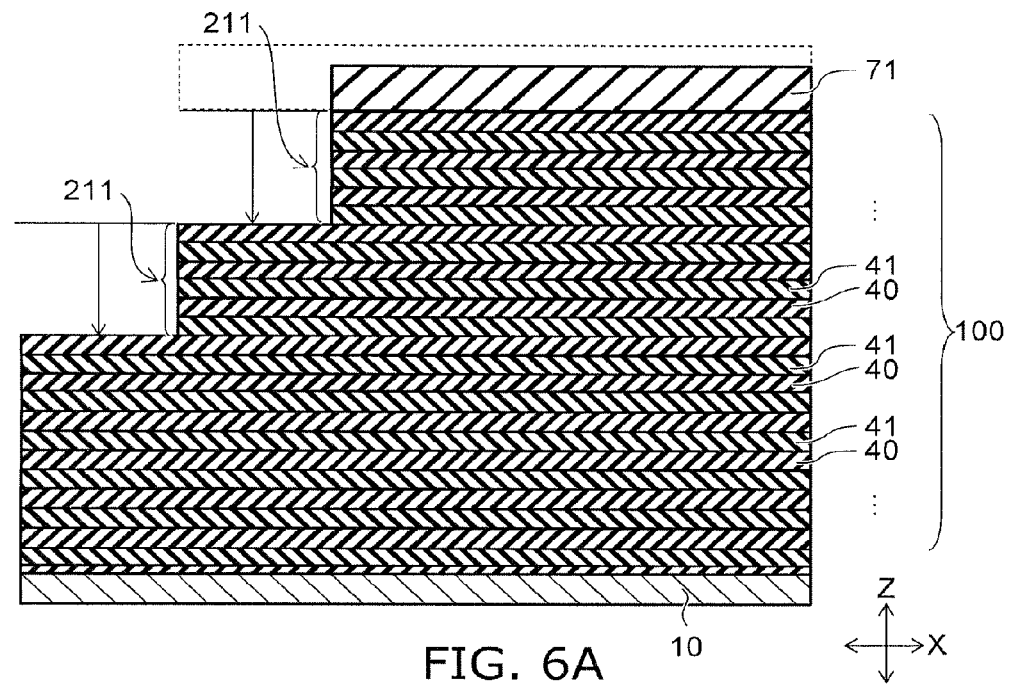

Next, as shown in FIG. 6A, after slimming the photoresist 71, the stacked body 100 is etched. A broken line of the drawing shows a surface of the photoresist 71 before slimming. Thereby, two steps 211 are formed.

Figure 6B:
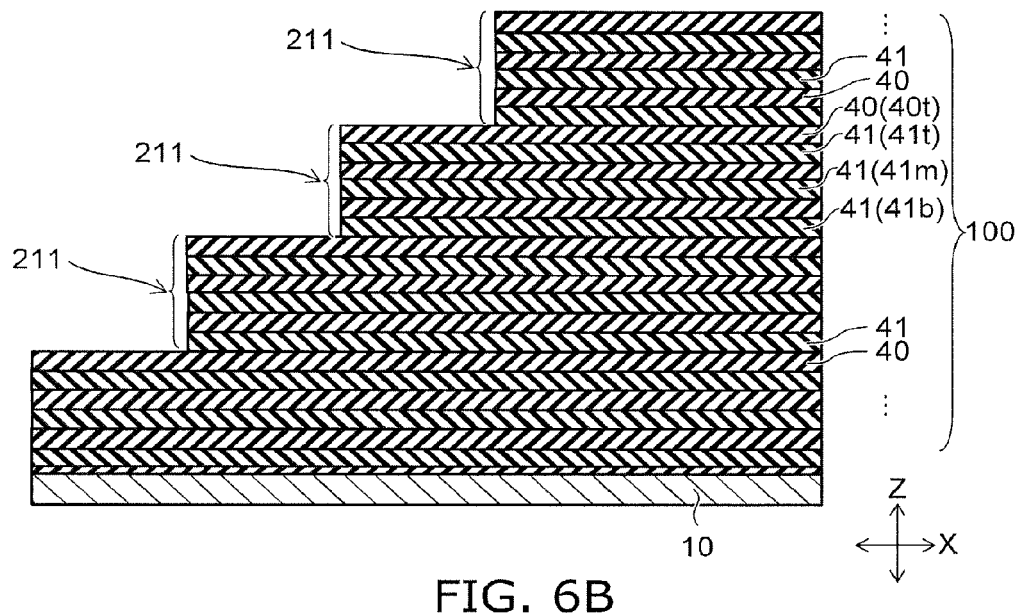

Next, as shown in FIG. 6B, a plurality of steps 211 is formed in a step-wise. The plurality of steps 211 is formed in a step-wise by repeating alternately slimming the photoresist 71 described above and etching the stacked body 100. This process is called as "step forming process". At this time, in the first embodiment, the respective steps 211 include 3 layers of the replacement members 41 and 3 layers of the insulators 40 in respectively different layers. Side surfaces of the 3 layers of the replacement members 41 and side surfaces of the 3 layers of the insulators 40 are exposed from the respective steps 211.

In the step forming process, for example, when the stacked body 100 is etched, a portion of one layer of the replacement member 41 and the insulator 40 may be removed. In this case, the same times of etching as the number of stacking of the replacement members 41 are necessary to be performed, and the number of processes increases. If the number of the step forming processes is large, the photoresist 71 is too thin by the slimming, and may not function as the mask of etching. In such a case, the photoresist 71 is necessary to be reformed again, and the number of processes increases.

In this respect, according to the first embodiment, in the step forming process, the 3 layers of the replacement members 41 and the 3 layers of the insulators 40 are removed at one time. For this reason, compared with the case of retreating one layer by one layer, the number of etching the stacked body 100 and the number of forming the photoresist 71 again can be reduced. Thereby, the number of processes can be reduced.

Here, the replacement members included in one step 211 are taken as a first replacement member 41t, a second replacement member 41m and a third replacement member 41b in order from the upper layer, and the insulator 40 formed on the first replacement member 41t is taken as a first insulator 40t.

<Forming Side Wall Film 51>

Figure 7A:
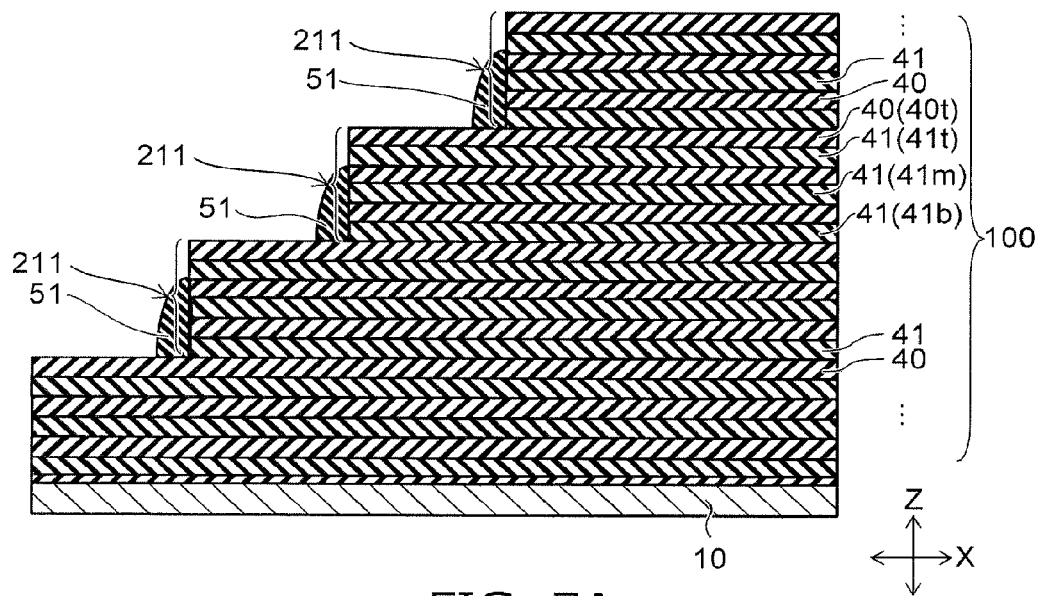

Next, as shown in FIG. 7A, a plurality of side wall films 51 contacting the respective steps 211 is formed. The plurality of side wall films 51 are separated, respectively. The plurality of side wall films 51, for example, forms the side wall film 51 to be conformal on the stacked body 100. At this time, a side surface of the first replacement member 41t and a side surface of the first insulator 40t contact a portion of the side wall film 51. Thereafter, the side wall film 51 of another portion separated from the step 211 is removed. Thereby, the plurality of side wall films 51 separated respectively is formed. At this time, the side surface of the first replacement member 41t and the side surface of the first insulator 40t are separated from the side wall film 51 and are exposed from the step 211. On the other hand, a side surface of the second replacement member 41m and a side surface of the third replacement member 41b contact the side wall film 51, and are not exposed from the step 211.

The side wall films 51 are, for example, formed to be conformal on the stacked body 100 by using a CVD method (chemical vapor deposition). Thereafter, the side wall film 51 of a portion separated from the side surface of the first replacement member 41t and the step 211 is removed. Thereby, the plurality of side wall films 51 separated respectively is formed.

The material of the side wall films 51 is selected from materials that can take an etching selection ratio to the replacement member 41. For example, when a silicon nitride film is selected as the replacement member 41, amorphous silicon is selected for the side wall films 51. The same material (for example, silicon oxide) as the insulator 40 may be selected as the side wall films 51. In this case, a material of a composition different from the insulator 40 is selected as the side wall films 51, for example, a material having a greater etching rate than the insulator 40 is selected. It is also possible to select, for example, a silicon nitride which is the same as the replacement member 41 as the side wall films 51, and the manufacturing method in that case is described later.

<Processing Replacement Member 41 and Insulator 40 in a Step-Wise>

Figure 7B:
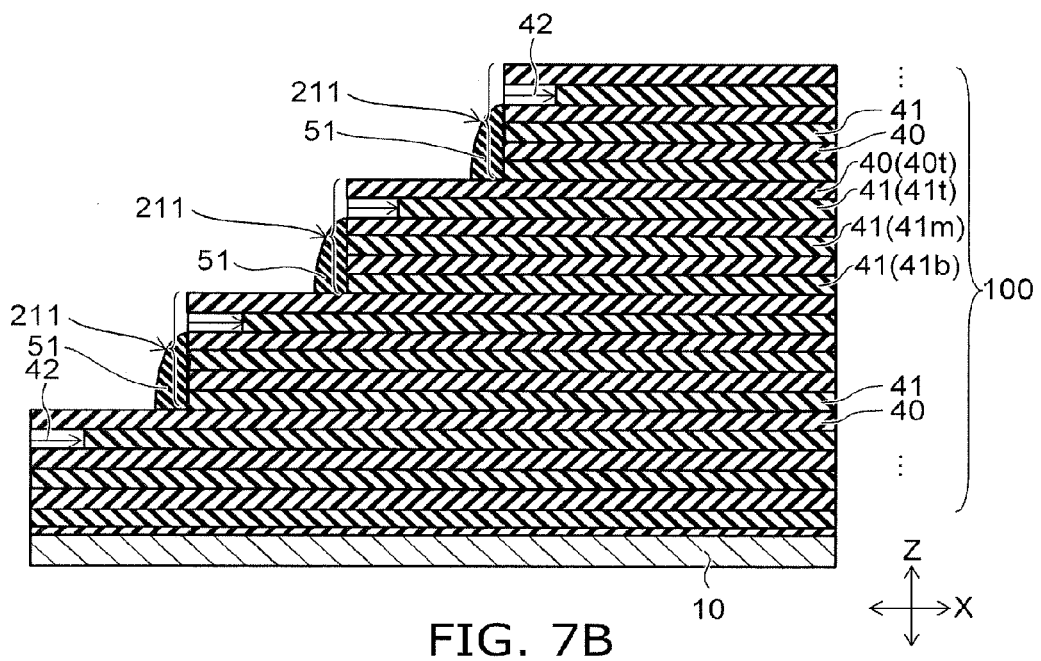

Next, as shown in FIG. 7B, the side surface of the replacement member 41 separated from the side wall film 51 and exposed from the step 211 is retreated. An arrow in the drawing shows the retreated portion of the replacement member 41. Thereby, a space 42 is formed in the retreated portion of the first replacement member 41t. For example, isotropic etching of wet etching or the like based on a phosphoric acid solution is used as the method for retreating the replacement member 41. At this time, since the side surface of the second replacement member 41m and the side surface of the third replacement member 41b contact the side wall film 51, they do not retreat. That is, only the replacement members 41 exposed from the respective steps 211 of the plurality of replacement members 41 can be retreated at one time.

Figure 8A:
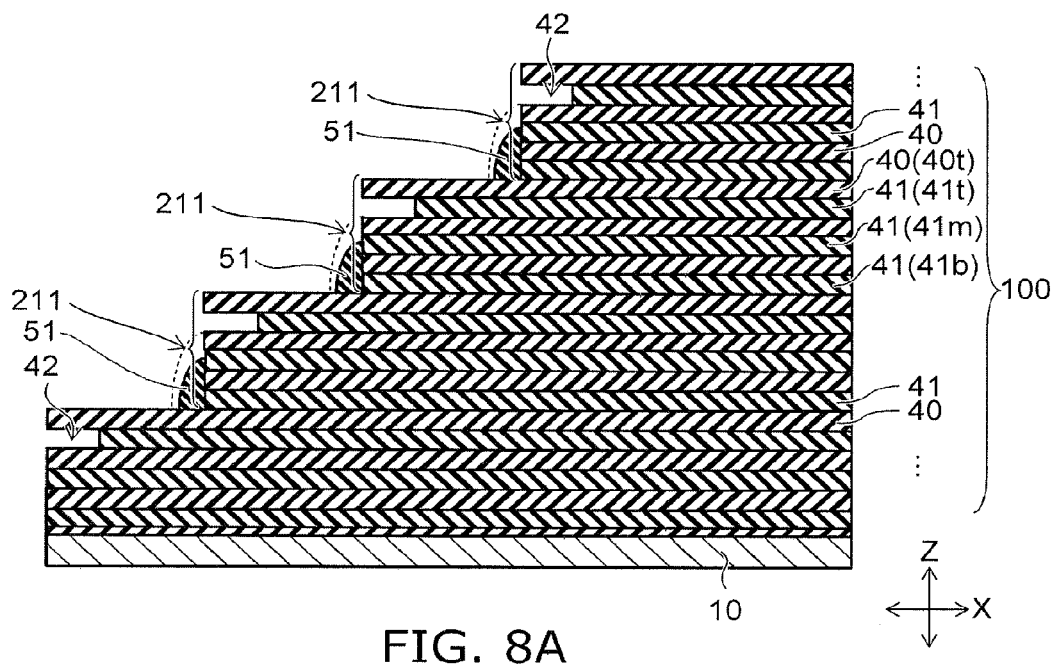

Next, as shown in FIG. 8A, the side wall film 51 is retreated. A broken line portion of the drawing shows a position of a surface before retreating the side wall film 51. For example, an anisotropic etching or an isotropic etching such as the RIE method or the like is used as the method for retreating the side wall film 51. At this time, a portion of the side wall film 51 contacting the second replacement member 41m is removed and the side surface of the second replacement member 41m is exposed from the step 211. On the other hand, the side surface of the third replacement member 41b remains to contact the side wall film 51 and is not exposed from the step 211.

Figure 8B:
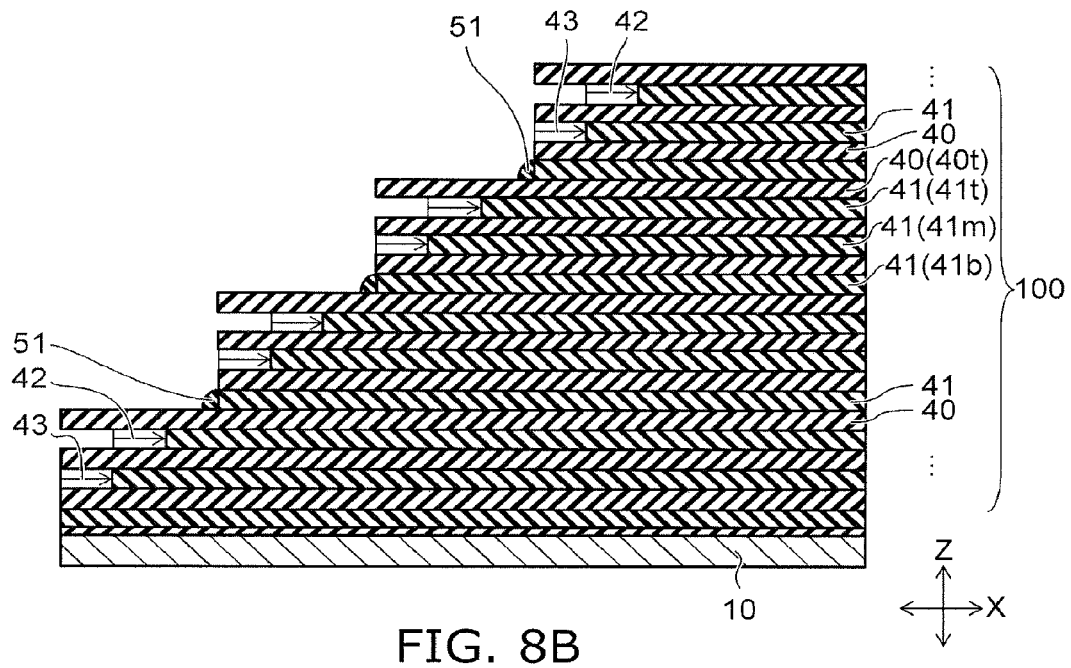

Next, as shown in FIG. 8B, the side surface of the replacement member 41 separated from the side wall film 51 and exposed from the step 211 is retreated. At this time, the space 42 is expanded by further retreating of the first replacement member 41t. A space 43 is formed in the retreated portion of the second replacement member 41m. On the other hand, since the side surface of the third replacement member 41b contacts the side wall film 51, it does not retreat.

Figure 9A:
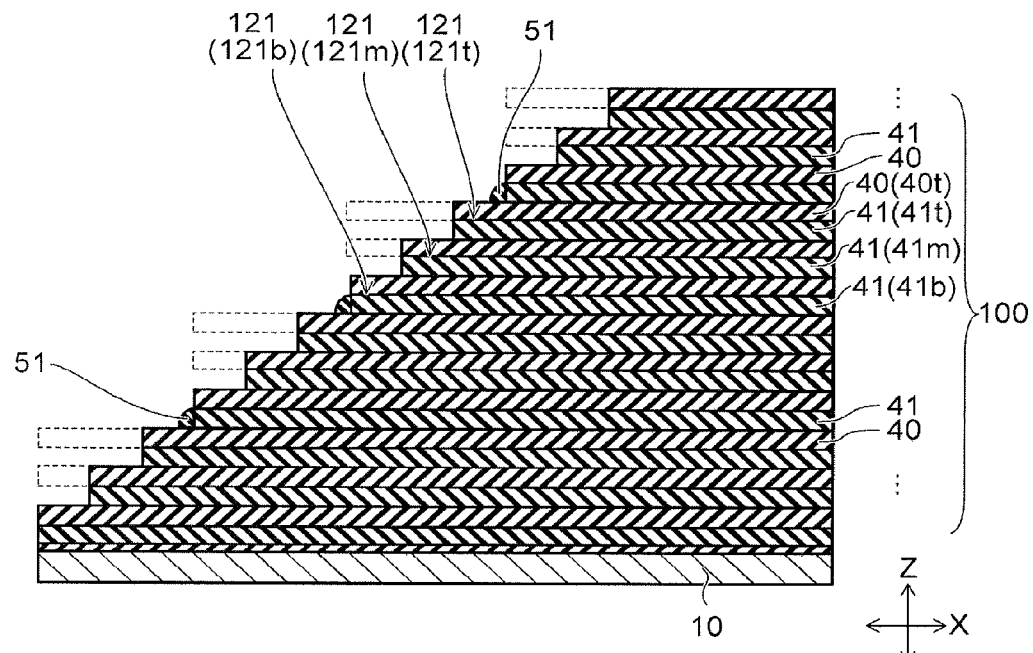

Next, as shown in FIG. 9A, the insulator 40 formed on the spaces 42, 43 and separated from the replacement member 41 is removed. A broken line portion in the drawing shows a position of the surface of the insulator 40 before removal. Thereby, an end portion of the respective replacement member 41 and an end portion of the respective insulators 40 are processed in a step-wise, and a terrace 121 is formed on an upper surface of the end portion of the respective replacement members 41.

Going through the process like this, the number of processes can be reduced compared with the method for forming the step structure by processing the replacement members 41 one layer by one layer. At this time, the plurality of side wall films 51 is left across the adjacent two terraces 121.

For example, in the case where not less than 4 layers of the replacement members 41 and not less than 4 layers of the insulators 40 are formed to the respective steps 211, by performing the process of retreating the replacement member 41 shown in FIG. 7B and FIG. 8B and the process of retreating the side wall film 51 shown in FIG. 8A alternately in a plurality, the end portion of the respective replacement members 41 is able to be processed in a step-wise to all steps 211. In the step forming process, the number of processes is able to be reduced, if the respective steps 211 include at least 2 layers of the replacement members 41 and at least 2 layers of the insulators 40. For example, also in the case where the steps 211 are formed in a step-wise also in the Y-direction in addition to the X-direction, the number of processes is able to be reduced similar to the processed described above.

<Forming Insulating Layer 81>

Figure 9B:
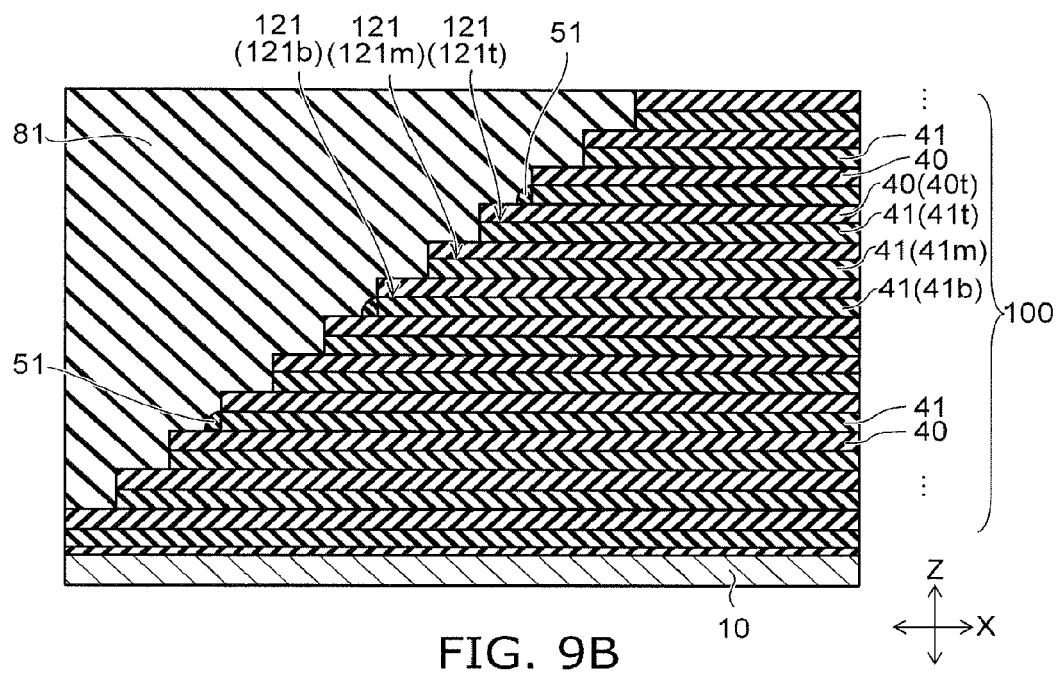

Next, as shown in FIG. 9B, the insulating layer 81 is formed on the respective terraces 121 via the insulator 40. The insulating layer 81 is, for example, based on a silicon oxide. Thereafter, an upper surface of the insulating layer 81 is retreated to coincide with the upper surface of the stacked body 100. Thereby, a depressed portion generated on the terrace 121 is embedded by the insulating layer 81.

<Forming Columnar Portion CL>

Figure 10A:
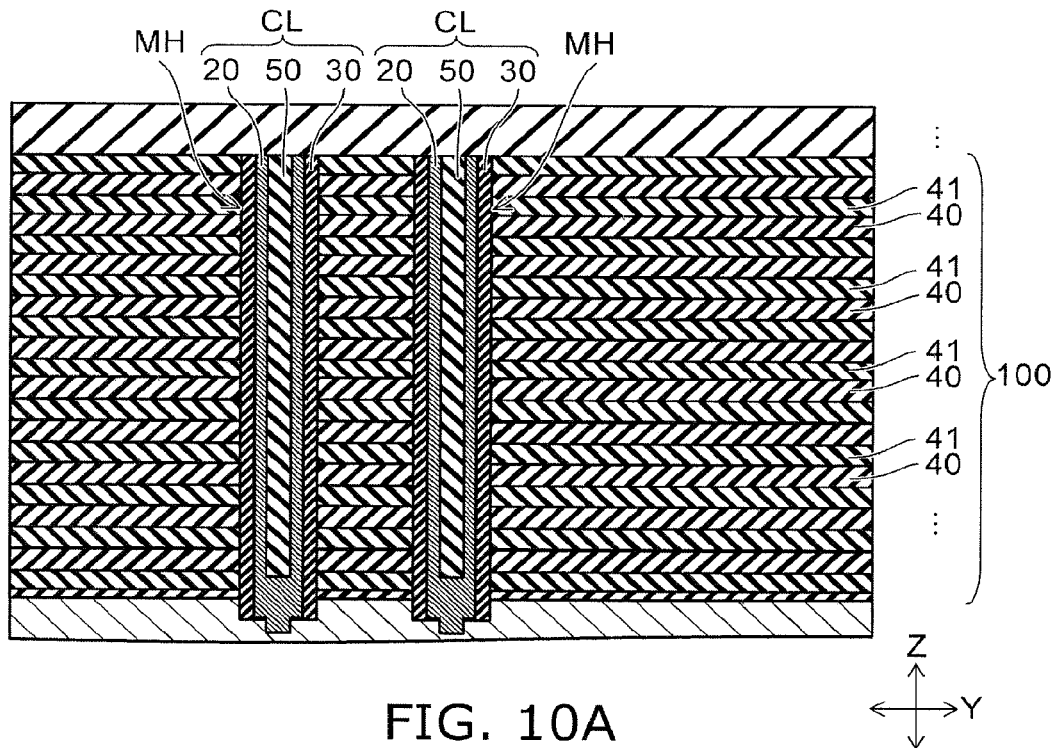

Next, as shown in FIG. 10A, the plurality of columnar portions CL is formed in the stacked body 100. The columnar portion is formed in a hole MH. The hole MH is formed, for example, by using the RIE method, pierces the stacked body 100 and reaches the substrate 10. The hole MH is separated from the terrace 121. The columnar portion CL is formed in the hole MH after forming process of the memory film 30, forming process of the semiconductor body 20, and forming process of the core layer 50. The columnar portion CL is separated from the plurality of terraces 121. The semiconductor body 20 contacts the substrate 10.

<Forming Electrode Layers (SGD, WL, SGS) (Replacing Process)>

Figure 10B:
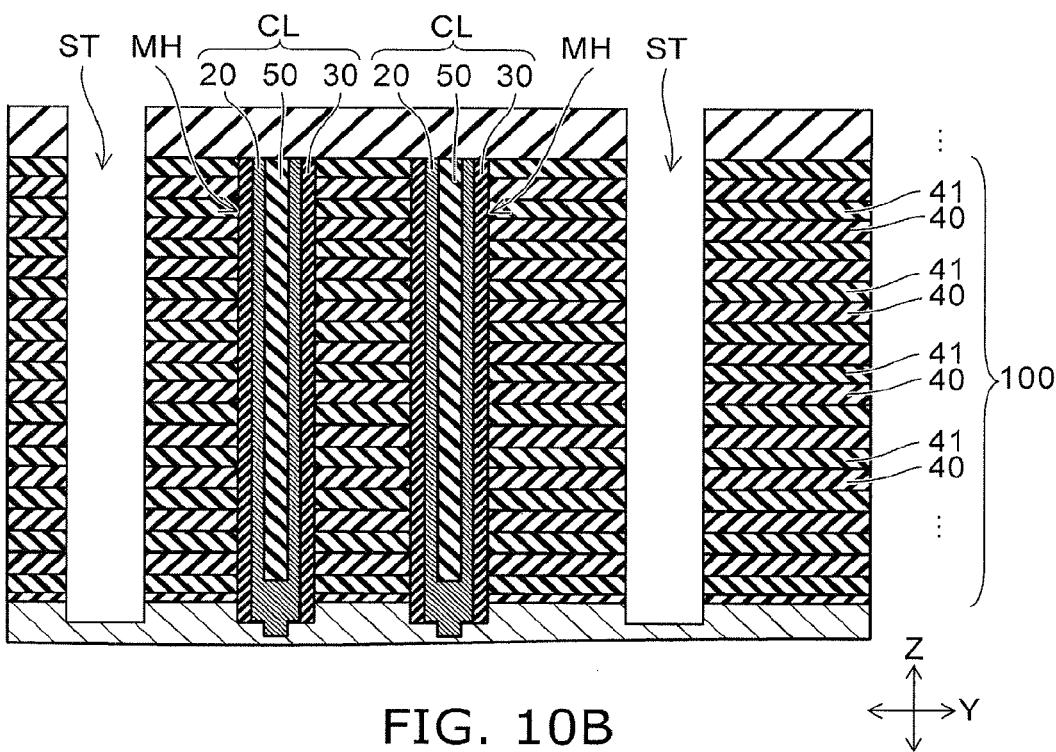

Next, as shown in FIG. 10B, the plurality of slits ST is formed in the stacked body 100. The slit extends in the Z-direction and the X-direction. The slit ST pierces the stacked body and reaches the substrate 10.

Figure 11:
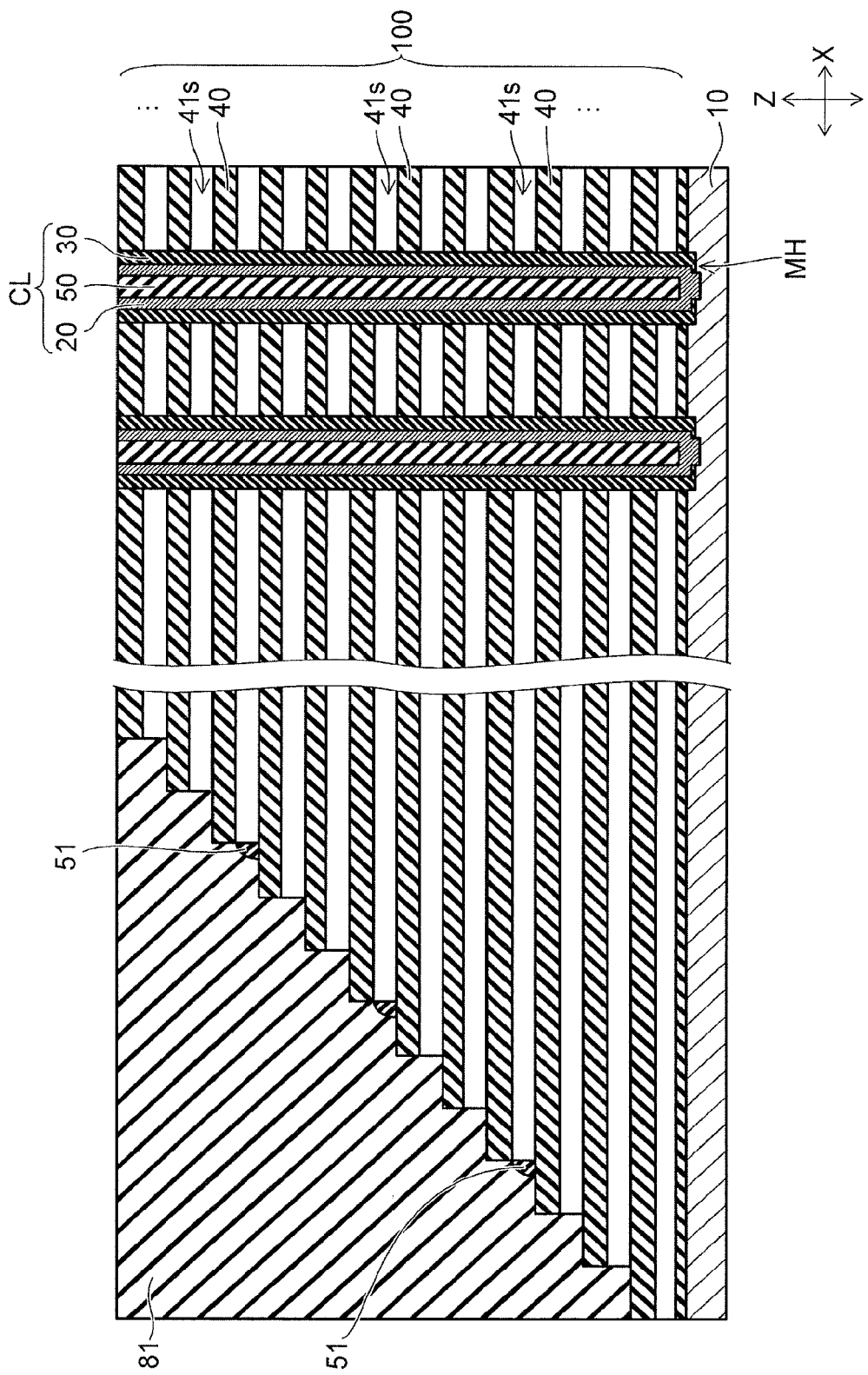

Next, as shown in FIG. 11, the replacement member 41 is removed from the stacked body 100 via the slit ST. Thereby, space 41s is formed in a portion removing the replacement member 41.

Figure 12:
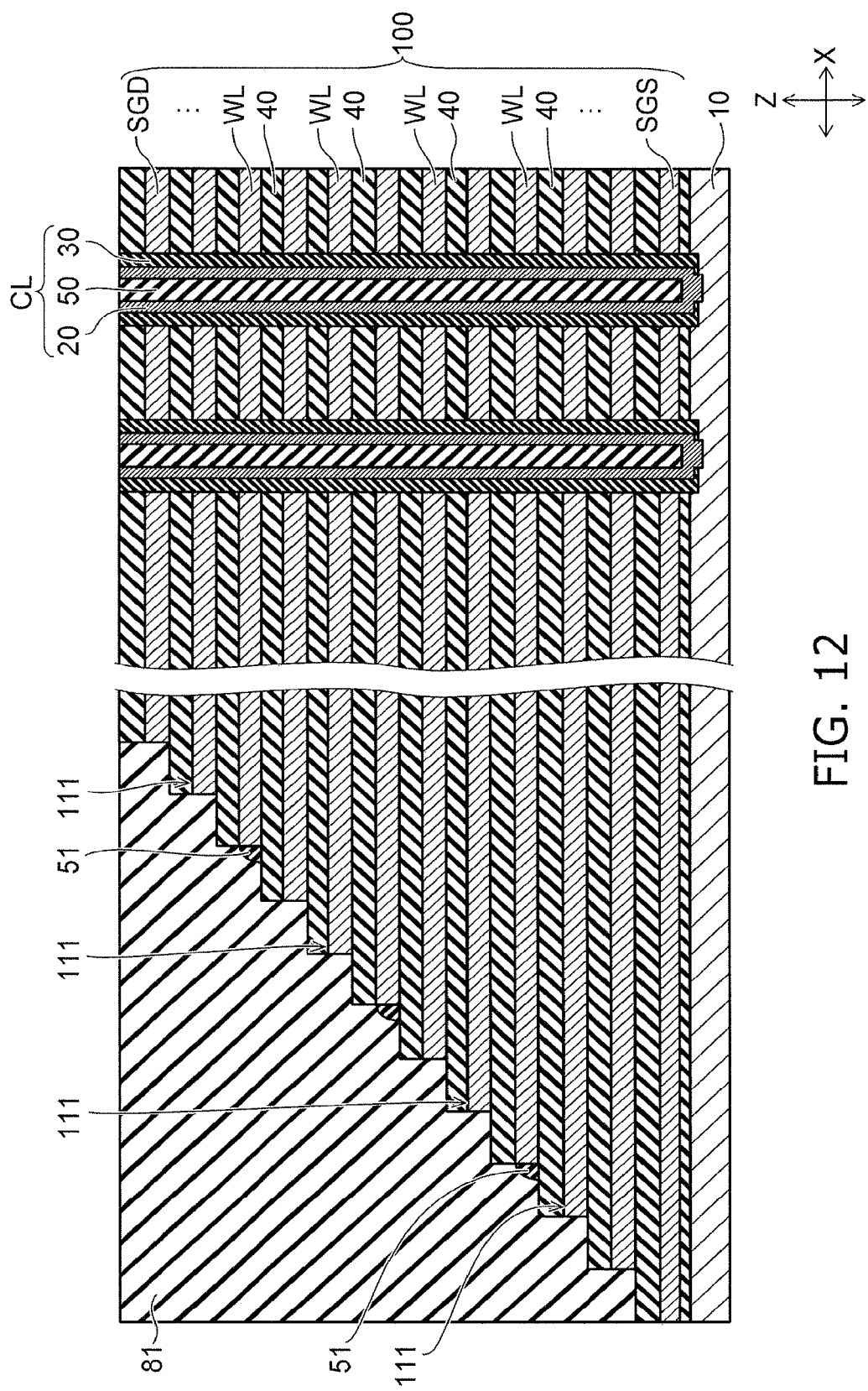
Figure 14:
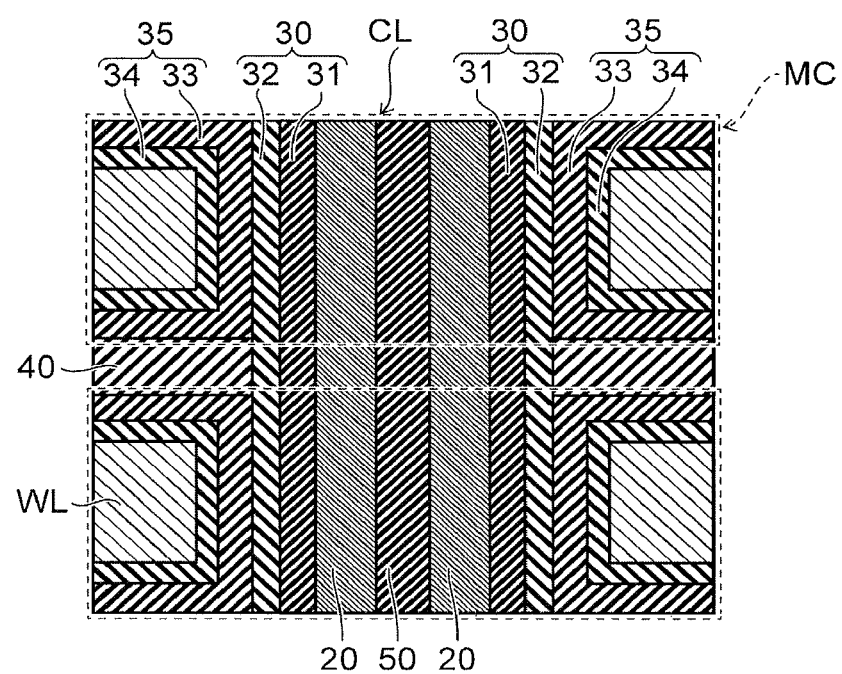
FIG. 14 is an enlarged schematic cross-sectional view of the broken line frame 14 in FIG. 3.

Next, as shown in FIG. 12, a block insulating film 35 shown in FIG. 14 (omitted in FIG. 12) and the electrode layers (SGD, WL, SGS) are formed in the portion removing the replacement member 41. The electrode layers (SGD, WL, SGS) include, for example, tungsten. The electrode layers (SGD, WL, SGS) surround circumference of the columnar portion CL. A series of processes shown in FIG. 11 and FIG. 12 are referred to as "replacing process".

<Forming Source Line SL and Contact Portion Cc>

Next, as shown in FIG. 2, the source line SL is formed in the slit ST. An insulating film not shown is formed between the source line SL and the stacked body 100, and the source line SL is separated from the stacked body 100.

Next, as shown in FIG. 3, the plurality of contact portions Cc extending in the Z-direction is formed in the insulating layer 81. The respective contact portions Cc contact the terrace 111 which is the contact region via the insulator 40. The respective contact portions Cc are connected to the electrode layer (SGD, WL, SGS) of 1 layer and are separated from other electrode layers (SGD, WL, SGS). Thereby, the step structure section 2 is formed.

Thereafter, the upper interconnect 80, the bit lines BL or the like shown in FIG. 2 are formed on the stacked body 100, and the semiconductor device of the first embodiment is formed.

First Embodiment: Other Manufacturing Methods

Next, with reference to FIG. 13A to FIG. 13C, other manufacturing method of the first embodiment will be described. The other manufacturing method is one example of the manufacturing method when the same material as the replacement member 41 is selected as the side wall film 51. In the other manufacturing method, the process of retreating the replacement member 41 shown in FIG. 7A to FIG. 8A and the process of retreating the side wall film 51 can be performed simultaneously. Therefore, the number or processes is possible to be reduced.

Figure 13A:
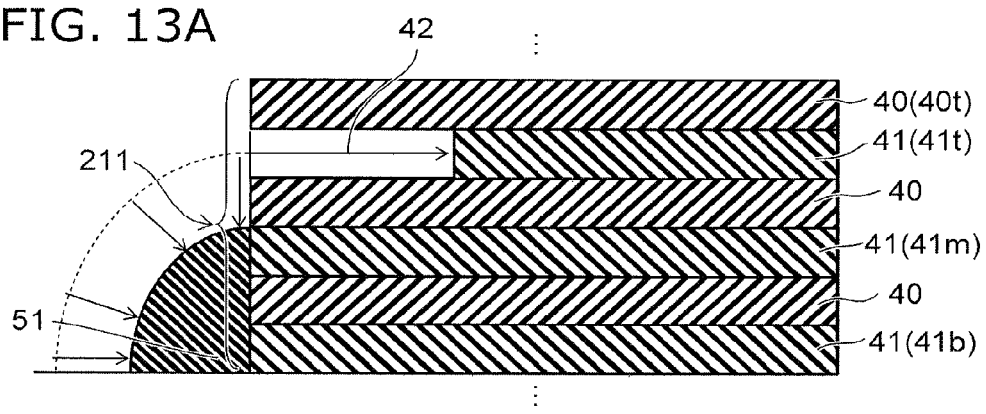
FIG. 13A to FIG. 13C are schematic views showing other method for manufacturing the semiconductor device of the first embodiment.
Figure 13B:
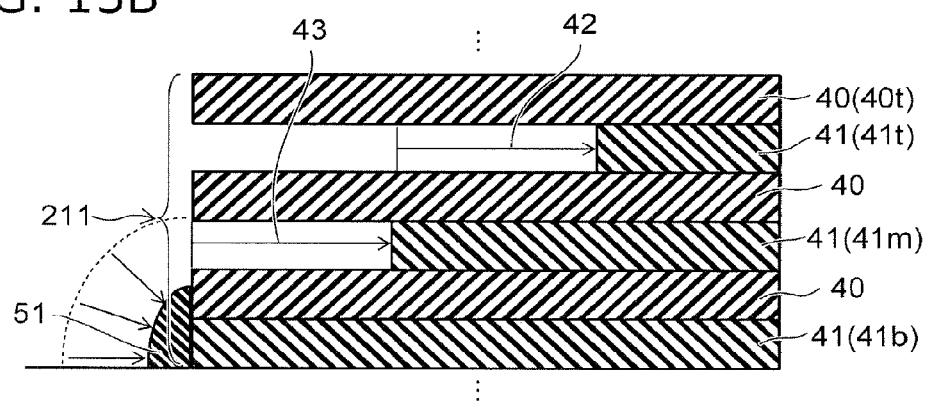

FIG. 13A and FIG. 13B are schematic cross-sectional views showing other method for manufacturing the semiconductor device of the embodiment.

<Forming the Stacked Body 100 to Forming Side Wall Film 51>

The process from forming the stacked body 100 to forming the side wall film 51 shown in FIG. 5A to FIG. 7A are the same as the manufacturing method described above. In the manufacturing method, the side wall film 51 and the replacement member 41 include silicon nitride with different composition ratio, respectively and the replacement member 41 has a greater etching rate than the side wall film 51. The etching rates of the replacement member 41 and the side wall film 51 are possible to be set arbitrarily, for example, by changing a composition ratio of silicon. The materials other than the silicon nitride described above are arbitrary as long as being materials capable of taking an etching selection ratio to the insulator 40.

<Processing Replacement Member 41 and Insulator 40 in a Step-Wise>

Next, as shown in FIG. 13A, the side wall film 51 is retreated simultaneously with retreating of the side surface of the first replacement member 41t exposed from the step 211. Arrows in the drawing show the retreated portions of the replacement member 41 and the side wall film 51. For example, isotropic etching of wet etching or the like based on a phosphoric acid solution is used as the method for retreating the replacement member 41 and the side wall film 51.

Thereafter, as shown in FIG. 13B, a portion of the side wall film 51 contacting the second replacement member 41m is removed with retreating of the side wall film 51, and the second replacement member 41m is exposed from the step 211. For this reason, continuing etching also allows the side surface of the second replacement member 41m to retreat simultaneously with the first replacement member 41t and the side wall film 51. Thereby, the spaces 42, 43 are formed in the retreated portions of the first replacement member 41t and the second replacement member 41m. At this time, timing of etching start of the second replacement member 41m can be adjusted by an etching rate of the side wall film 51 and a film thickness or the like. Therefore, a retreated amount of the first replacement member 41t and a retreat amount of the second replacement member 41m in the etching are possible to be adjusted arbitrarily.

Next, the process shown in FIG. 9A is performed, end portions of the respective replacement members 41 and end portions of the respective insulators 40 are processed in a step-wise, and the terrace 121 is formed on an upper surface of the end portions of the respective replacement members 41.

<Forming Insulating Layer 81 to Forming Contact Portion Cc>

Thereafter, the process shown in FIG. 9B is performed, and the semiconductor device of the embodiment is formed.

The manufacturing method described above is possible to be performed also in the case of selecting a metal member in place of the replacement member 41. In this case, for example, a silicon nitride is selected as the insulator 40 and a silicon oxide film is selected as the side wall film 51. For example, in the case where tungsten is used as the metal member, wet etching based on sulfuric acid/hydrogen peroxide mixture is used. It is possible to form the semiconductor device without replacement process by selecting the metal member in place of the replacement member 41. Thereby, the number of processes can be reduced. Also in the embodiment described later, the metal member may be selected in place of the replacement member 41, and also in that case, the semiconductor device is possible to be formed without the replacement process.

First Embodiment: Side Wall Film 51

Figure 13C:
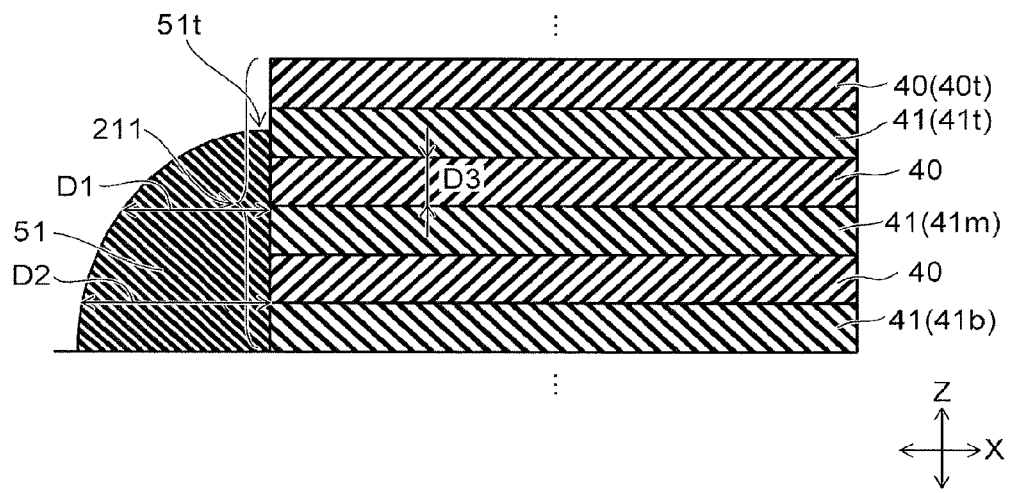

FIG. 13C is a schematic cross-sectional view showing a shape when the side wall film 51 is formed.

As shown in FIG. 13C, an uppermost portion 51t of the side wall film 51 is formed at a height between the upper surface of the first replacement member 41t and the upper surface of the second replacement member 41m. If the uppermost portion 51t is formed during this time, etching of the side wall film 51 and etching of the first replacement member 41t can be started at the same timing, and fluctuation of the retreated amount of the first replacement member 41t can be reduced.

The side wall film 51 has a thickness D1 in the X-direction on the same plane as the upper surface of the second replacement member 41m. The side wall film 51 has a thickness D2 in the X-direction on the same plane as the upper surface of the third replacement member 41b. At this time, the relationship among the respective thicknesses D1, D2 and a thickness D3 of the insulator 40 in the Z-direction satisfies formulae (1) to (3).

$$D1 > 1 + \alpha \tag{1}$$

$$D2 > 2 + 2\alpha \tag{2}$$

$$\alpha = D3 \times (\text{etching rate of side wall film})/(\text{etching rate of replacement member}) \tag{3}$$

The replacement member 41 can be retreated in order from the upper layer by satisfying the formulae (1) to (3). For example, when the formulae (1) to (3) are not satisfied, the film thickness of the side wall film 51 in the X-direction becomes thin before the replacement member 41 is exposed from the step 211 in order from the upper layer, and thus the side wall film 51 may not function as the protection film. For this reason, the replacement member 41 cannot be retreated in order from the upper layer, and the end portion of the replacement member 41 cannot be processed in a step-wise. On the other hand, in the first embodiment, the formulae (1) to (3) are satisfied. For this reason, timing when the side surface of the replacement member 41 is exposed from the step 21 can be controlled by using the retreated amount of the side wall film 51. Thereby, compared with the method forming the step structure by processing the replacement member 41 one layer by one layer, the replacement member 41 can be processed in a step-wise with the small number of processes.

First Embodiment: Columnar Section CL

Next, with reference FIG. 14, on example of the columnar section CL of the first embodiment will be described.

FIG. 14 is an enlarged schematic cross-sectional view of the broken line frame 14 in FIG. 3.

As shown in FIG. 14, the memory film 30 includes a tunnel insulating film 31 and a charge storage film 32. The charge storage film 32 is provided to be in contact with the stacked body 100. The charge storage film 32 includes, for example, a silicon nitride. The charge storage film 32 may a hafnium oxide other than the silicon nitride. The charge storage film 32 has a trap site trapping a charge in the film. A threshold value of the memory cell MC changes depending on presence or absence of the charge trapped at the trap site and the amount of trapped charge. Thereby, the memory cell MC holds information.

The tunnel insulating film 31 is provided between the charge storage film 32 and the semiconductor body 20. The tunnel insulating film 31 includes, for example, a silicon oxide or a silicon oxide and a silicon nitride. The tunnel insulating film 31 is a potential barrier between the charge storage film 32 and the semiconductor body 20. When a charge injects from the semiconductor body 20 into the charge storage film 32 (writing operation) and a charge is emitted from the charge storage film 20 to the semiconductor body 20 (erasure operation), the charge tunnels through the tunnel insulating film 31.

Although not shown in FIG. 14, the memory film 30 may include, for example, a cover insulating film. The cover insulating film is provided between the charge storage film 32 and the stacked body 100. The cover insulating film includes, for example, a silicon oxide. For example, in the process of removing the replacement member 41 shown in FIG. 11, the cover insulating film protects the charge storage film 32 from etching.

The block insulating film 35 is provided in the stacked body 100. The block insulating film 35 is provided between the insulator 40 and the electrode layers (SGD, WL, SGS: FIG. 14 describes only WL) and between the electrode layers (SGD, WL, SGS) and the memory film 30. The block insulating film 35 is along a plane direction (XY-plane) of the stacked body 100 between the insulator 40 and the electrode layers (SGD, WL, SGS). The block insulating film 35 is along the stacking direction (Z-direction) between the electrode layers (SGD, WL, SGS) and the memory film 30. The block insulating film 35 includes a first block insulating layer 33 and a second insulating layer 34.

The first block insulating layer 33 is provided on a side of the memory film 30 in the block insulating film 35. The first block insulating layer 33 is provided continuously from a lower end of the block insulating film 35 toward an upper end of the block insulating film 35. The second block insulating layer 34 is provided on an electrode layers (SGS, WL, SGD) side in the block insulating film 35. The second block insulating layer 34 is provided continuously along the first block insulating layer 33. The first block insulating layer 33 includes a material different from the second block insulating layer 34. For example, the first block insulating layer 33 is an insulating material having a silicon oxide as a major component. The first block insulating layer 33 is, for example, $SiO_2$. On the other hand, the second block insulating layer 34 is an insulating material having a metal oxide as a major component. The metal is, for example, aluminum. The second block insulating layer 34 is, for example, $Al_2O_3$. The first block insulating layer 33 has a first relative permittivity. The second block insulating layer 34 has a second relative permittivity higher than the first relative permittivity.

Although not shown in FIG. 14, a barrier film may be provided between the block insulating film 35 and the electrode layers (SGD, WL, SGS). The barrier film includes, for example, a titanium nitride. The barrier film may, for example, titanium and the titanium nitride. The block insulating film 35 is provided between the charge storage film 32 and the stacked body 100, and may extend in the stacking direction (Z-direction).

As described above, according to the embodiment, the numbers of processes of forming the step structure section is possible to be reduced.

Second Embodiment: Semiconductor Device

Figure 15:
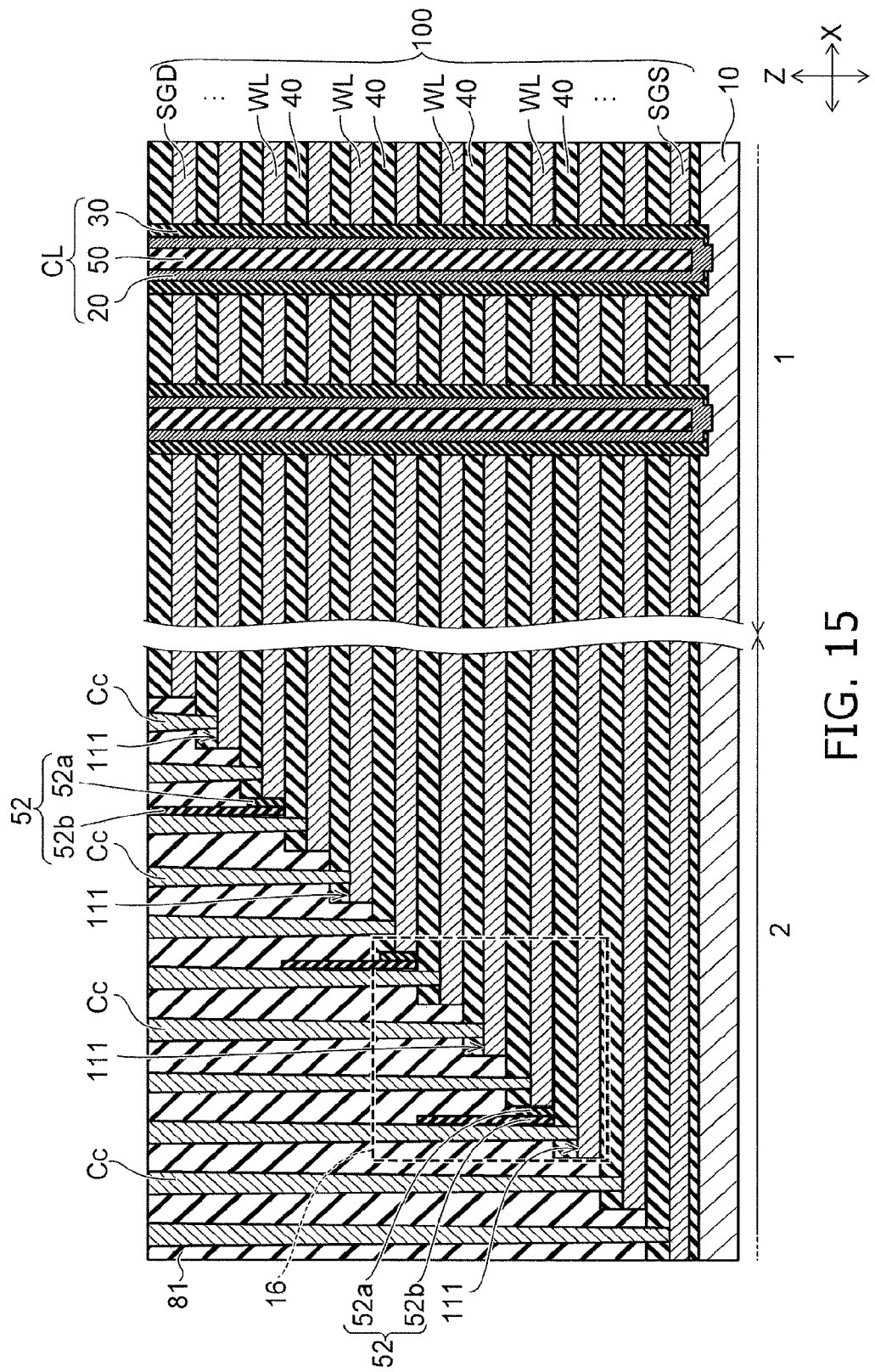
FIG. 15 is a schematic cross-sectional view of a semiconductor device of a second embodiment.
Figure 16:
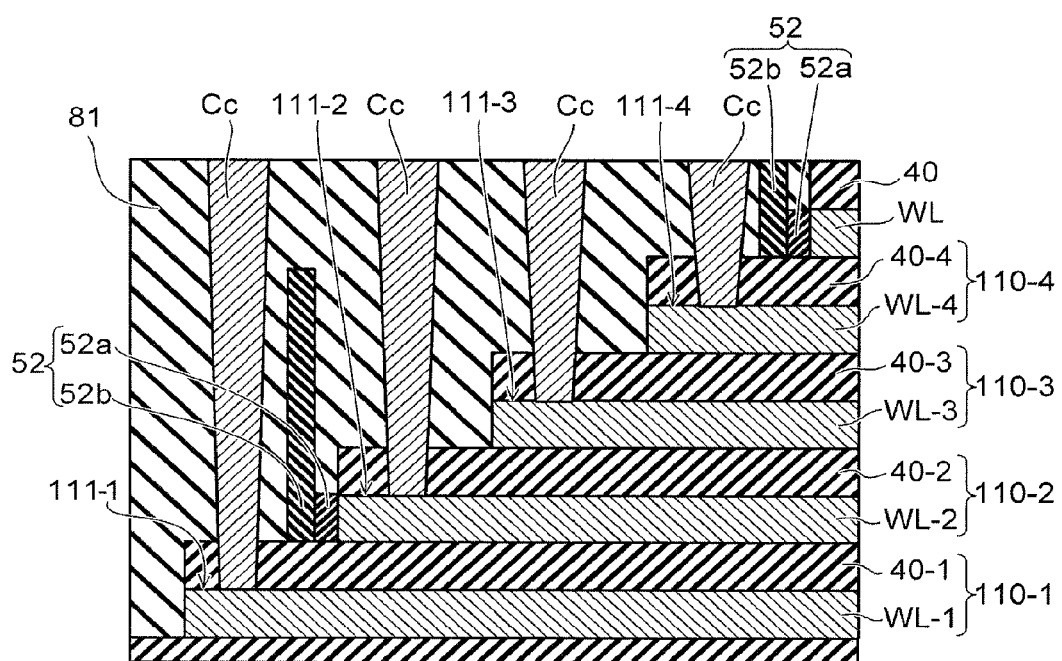
FIG. 16 is an enlarged schematic cross-sectional view of a broken line 16 in FIG. 15.

FIG. 15 is a schematic cross-sectional view of a semiconductor device of the second embodiment. The cross-sectional view shown in FIG. 15 corresponds to the cross-sectional view shown in FIG. 3. FIG. 16 is an enlarged schematic cross-sectional view of a broken line 16 in FIG. 15.

As shown in FIG. 15 and FIG. 16, the semiconductor device of the second embodiment is different from the semiconductor device of the first embodiment in that a side wall film 52 includes a first film 52a and a second film 52b.

As shown in FIG. 16, the first film 52a and the second film 52b are provided on the first terrace 111-1 via the first insulator 40-1. The first film 52a contacts an upper surface of the first insulator 40-1 and a side surface of the second electrode layer WL-2. The second film 52b contacts an upper surface of the first insulator 40-1 and a side surface of the first film 52a, and is separated from the second electrode layer WL-2.

The first film 52a and the second film 52b are provided on the fourth terrace 111-4 via the fourth insulator 40-4. The first film 52a contacts an upper surface of the fourth insulator 40-4 and a side surface of the electrode layer WL on the fourth insulator 40-4. The second film 52b contacts the upper surface of the fourth insulator 40-4 and a side surface of the first film 52a, and is separated from the electrode layer WL on the fourth insulator 40-4.

A thickness of the second film 52b is thicker than a thickness of the first film 52a along the Z-direction. The first film 52a and the second film 52b include an insulating material. For example, in the case where the second film 52b includes a carbon inclusion (for example, hard carbon film), the first film 52a includes at least one of amorphous silicon, a silicon nitride and a silicon oxide. For example, in the case where the second film 52b includes amorphous silicon, the first film 52a includes at least one of a silicon nitride and a silicon oxide. For example, in the case where the second film 52b includes a silicon oxide, the first film 52a includes at least one of a silicon nitride and a silicon oxide having different composition from the second film 52b. For example, in the case where the second film 52b includes a silicon nitride, the first film 52a includes a silicon nitride having different composition from the second film 52b. In the case where the second film 52b includes at least one of a metal and a metal oxide, the first film 52a includes at least one of a silicon oxide and a silicon nitride.

Also in the second embodiment, the side wall film 52 including the first film 52a and the second film 52b is provided on the terrace 111 across the adjacent two terraces 111. For this reason, in the process of processing the replacement member 41 in a step-wise, the replacement member 41 not covered with the side wall film 52 is possible to be retreated selectively. Thereby, for example, compared with the method forming the step structure by processing the replacement member 41 one layer by one layer, the number of processes can be reduced.

Second Embodiment: Manufacturing Method

Next, a method for manufacturing the semiconductor device of the second embodiment will be described.

FIG. 17a to FIG. 19B are schematic cross-sectional views showing a method for manufacturing the semiconductor device of the second embodiment.

<Forming Stacked Body 100 to Forming Side Wall Film 52>

Figure 17A:
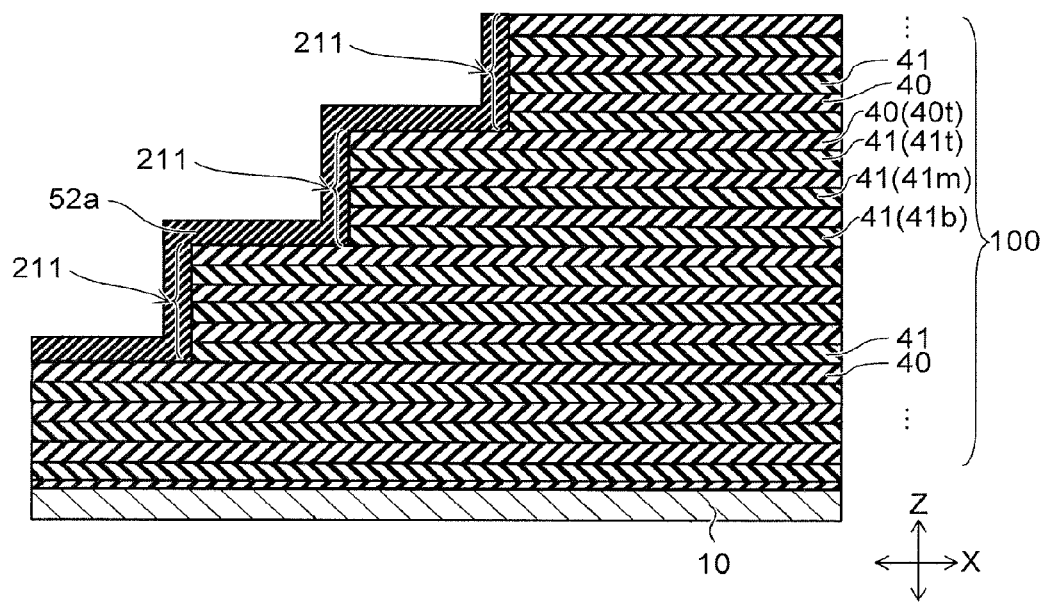
FIG. 17A to FIG. 20B are schematic cross-sectional views showing a method for manufacturing the semiconductor device of the second embodiment.

For example, according to the manufacturing method described with reference to FIG. 5A to FIG. 6B, a structure of the stacked body 100 shown in FIG. 17 is achieved. FIG. 17A shows a state where the first film 52a is formed to be conformal on the stacked body 100 after forming a step-wise step 211.

Figure 17B:
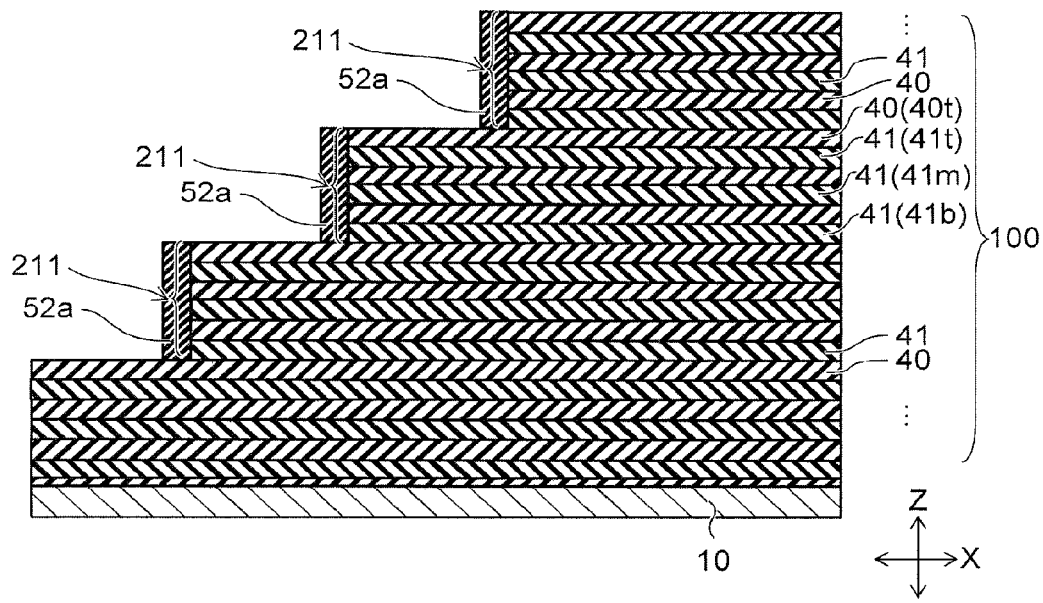

Next, as shown in FIG. 17B, the first film 52a of a portion separated from the step 211 is removed. Thereby, the plurality of first films 52a separated respectively is formed.

Figure 18A:
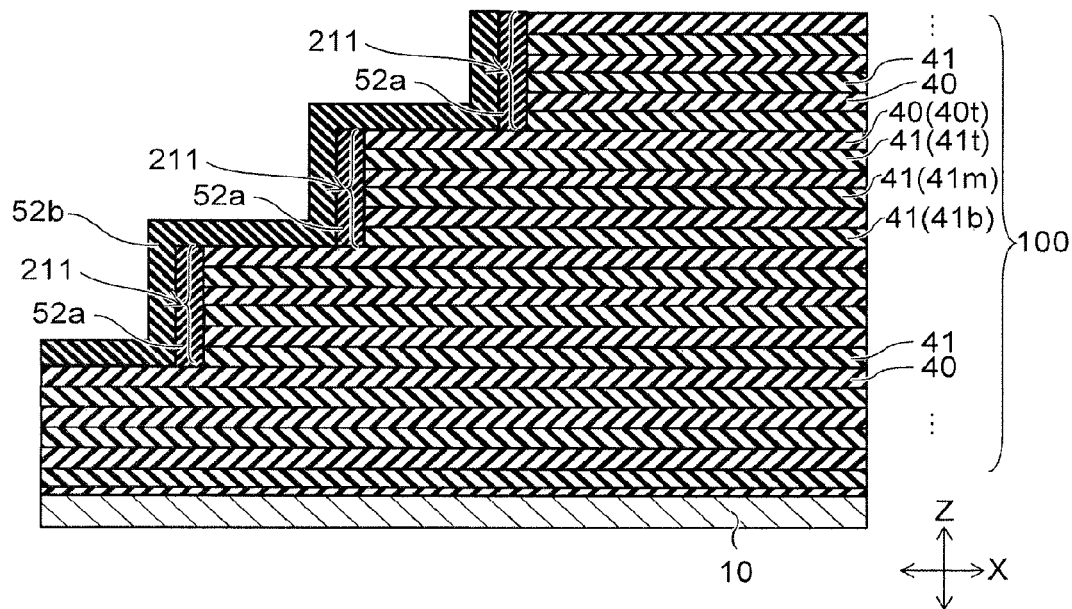

Next, as shown in FIG. 18A, the second film 52b is formed to be conformal on the stacked body 100. At this time, the side surface and an upper surface of the first film 52a contact the second film 52b.

Figure 18B:
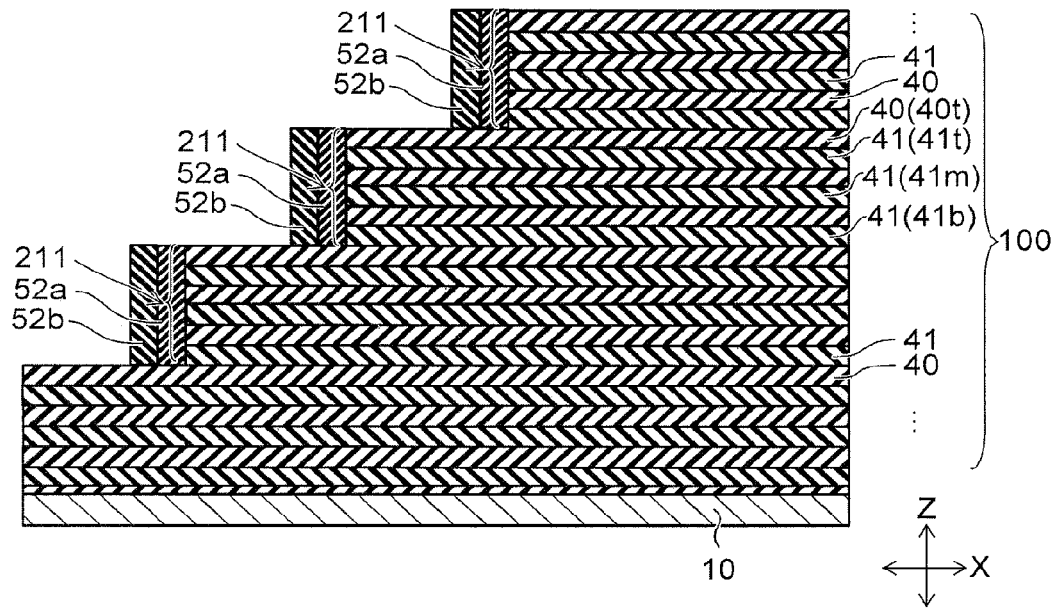

Nest, as shown in FIG. 18B, the second film 52b of a portion separated from the first film 52a is removed. Thereby, the plurality of second films 52b separated respectively is formed.

The material of the first film 52a is selected from materials that can take an etching selection ratio to the insulator 40. The material of the second film 52b is selected from materials that can take an etching selection ratio to the replacement member 41, the insulator 40 and the first film 52a, for example, the etching rate of the second film 52b is less than the etching rate of the first film 52a.

For example, when the carbon inclusion is selected as the second film 52b, one of amorphous silicon, a silicon nitride and a silicon oxide is selected as the first film 52a. For example, when amorphous silicon is selected as the second film 52b, one of the silicon oxide and the silicon nitride film is selected as the first film 52a. For example, when a silicon oxide film is selected as the second film 52b, one of the silicon nitride and the silicon oxide film having a different composition from the second film 52b is selected as the first film 52a. For example, when the silicon nitride film is selected as the second film 52b, the silicon nitride film having a different composition from the second film 52b is selected as the first film 52a. For example, when a metal is selected as the second film 52b, one of the silicon oxide film and the silicon nitride film is selected as the first film 52a. In the case where the materials of the first film 52a and the second film 52b are the same as the replacement member 41 or the insulator 40, materials having respectively different compositions are used, and thus the etching selection ratio can be taken.

After forming the plurality of first films 52a shown in FIG. 17B, the side surface of the first film 52a may be subjected to oxidation treatment. In this case, a portion subjected to the oxidation treatment of the first film 52a is taken as the second film 52b. For example, in the case where the material having a lower etching rate than the first film 52a is selected as the second film 52b, when the first film 52a described later is etched, it is sufficient that the second film 52b is formed with a film thickness so that the side surface of the first film 52a is not exposed even though the second film 52b is removed.

<Processing Replacement Member 41 in a Step-Wise>

Figure 19A:
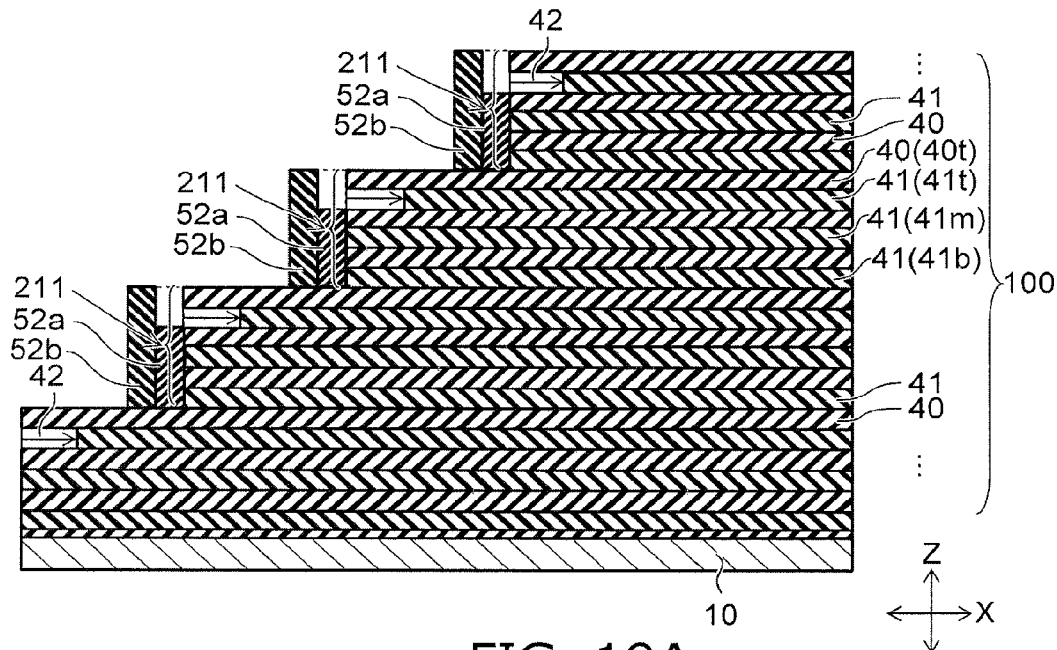

Next, as shown in FIG. 19A, the first film 52a is retreated. A broken line portion of the drawing shows a position of the upper surface of the first film 52a before retreating of the first film 52a. Thereby, the side surface of the first replacement member 41t and the side surface of the first insulator 40t are separated from the first film 52a and exposed from the step 211. For example, an anisotropic etching or an isotropic etching such as the RIE method or the like is used as the method for retreating the first film 52a. At this time, since the side surface of the first film 52a contacts the second film 52b, it does not retreat.

Thereafter, the side surface of the replacement member 41 exposed from the step 211 is retreated. An arrow in the drawing shows the retreated portion of the replacement member 41. Thereby, the space 42 is formed in the retreated portion of the first replacement member 41t.

Figure 19B:
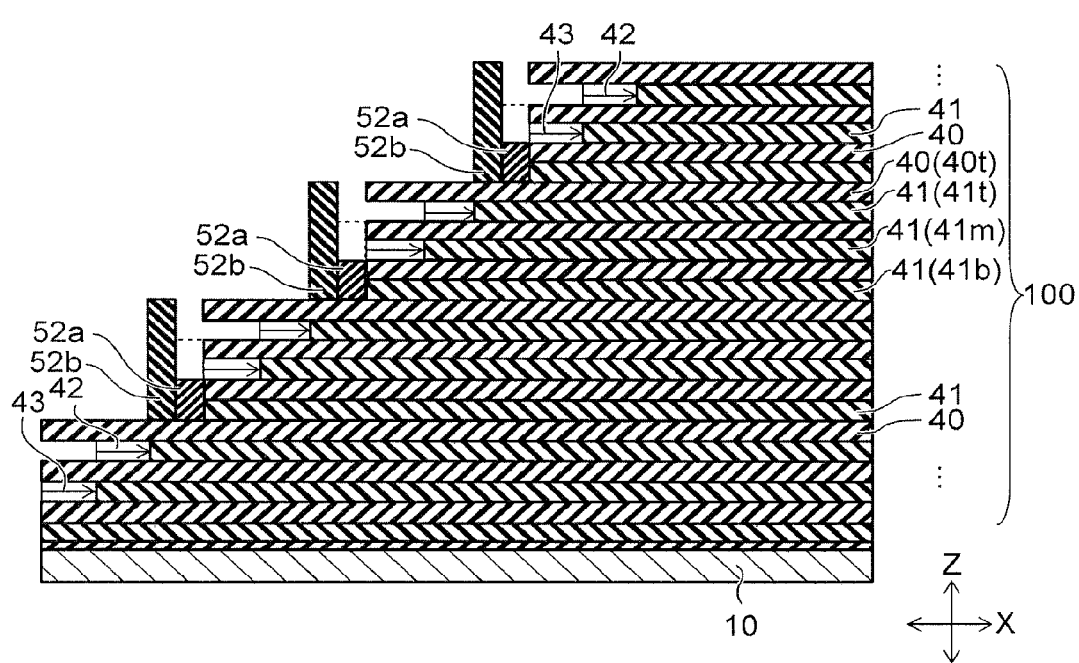

Next, as shown in FIG. 19B, the first film 52a is retreated, thereafter the side surface of the replacement member 41 exposed from the step 211 is retreated. At this time, the first replacement member 41t is further retreated, and thus the space is expanded. The space 43 is formed in the retreated portion of the second replacement member 41m. That is, similar to the first embodiment described above, only the replacement members 41 exposed from the respective steps of the plurality of replacement members 41 can be retreated at one time. For this reason, in the process of processing the replacement member 41 in a step-wise, the number of processes can be reduced.

In the case where the same material as the replacement member 41 (for example, silicon nitride) is selected as the first film 52a, similar to the first embodiment described above, the retreating of the replacement member 41 and the retreating of the first film 52a may be performed simultaneously. With respect to the detail, for example, see FIG. 13A and FIG. 13B.

Figure 20A:
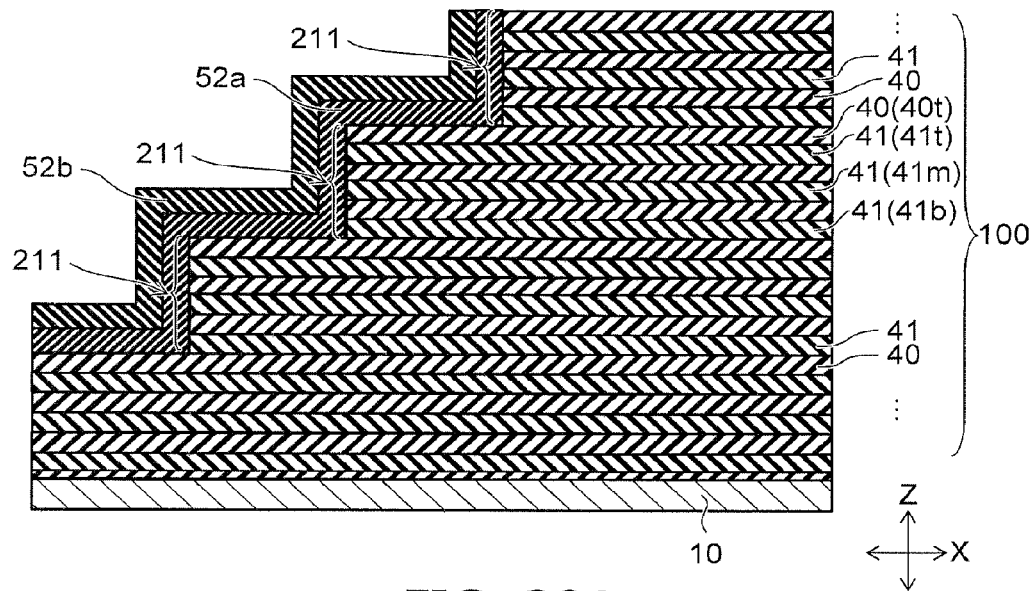
Figure 20B:
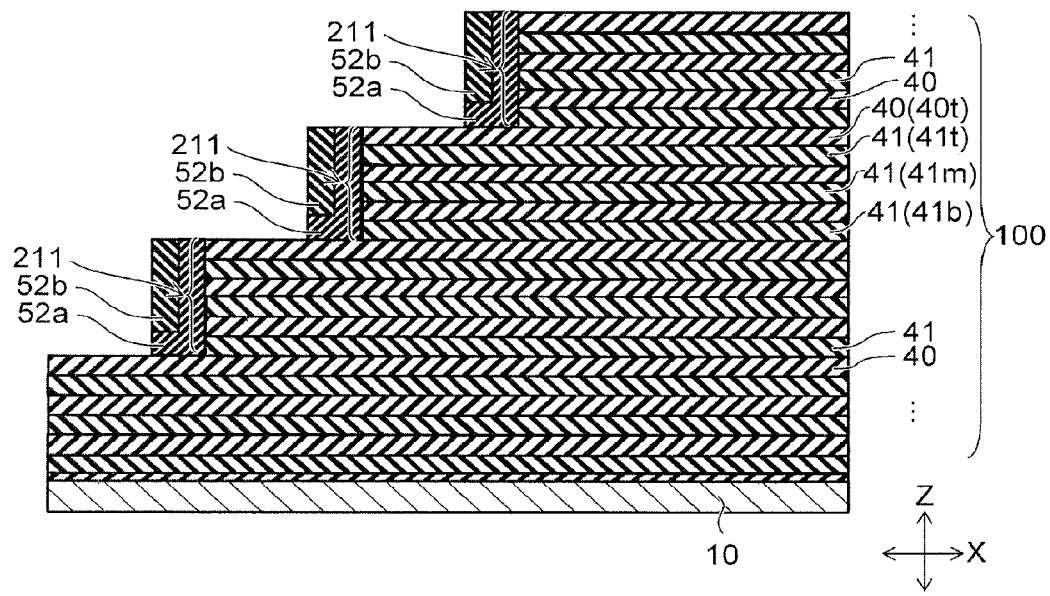

For example, when the side wall film 52 is formed, as shown in FIG. 20A and FIG. 20B, after forming the first film 52a and the second film 52b sequentially, the first film 52a and the second film 52b may be removed at one time. Thereby, the first film 52a is formed on the side surface of the second film 52b and under the second film 52b. In this case, an isotropic etching such as RIE or the like is used for the etching method of the first film 52a shown in FIG. 19A. For this reason, the first film 52a formed under the second film 52b is not etched and the etching of the replacement member 41 is not influenced. After that, in the case where conductive materials such as amorphous silicon, and a metal or the like are selected as the first film 52a and the second film 52b, the second film 52b is subjected to oxidation treatment. For example, a radical oxidation method, an ozone oxidation method, ISSG (In-situ Steam Generation) oxidation method, a thermal oxidation treatment method or the like are used. Oxidation treatments the first film 52a and the second film 52b are performed at arbitrary timing, and may be performed simultaneously with oxidation treatments in other process. The first film 52a and the second film 52b may be, for example, subjected to a nitriding treatment in place of the oxidation treatment and may be removed.

<Processing Insulator 40 in a Step-Wise to Forming Contact Portion Cc>

After that, for example, the semiconductor device of the second embodiment is formed by the similar process to the first embodiment described above. With respect to the detail, see FIG. 9A to FIG. 12.

Third Embodiment: Semiconductor Device

Figure 21:
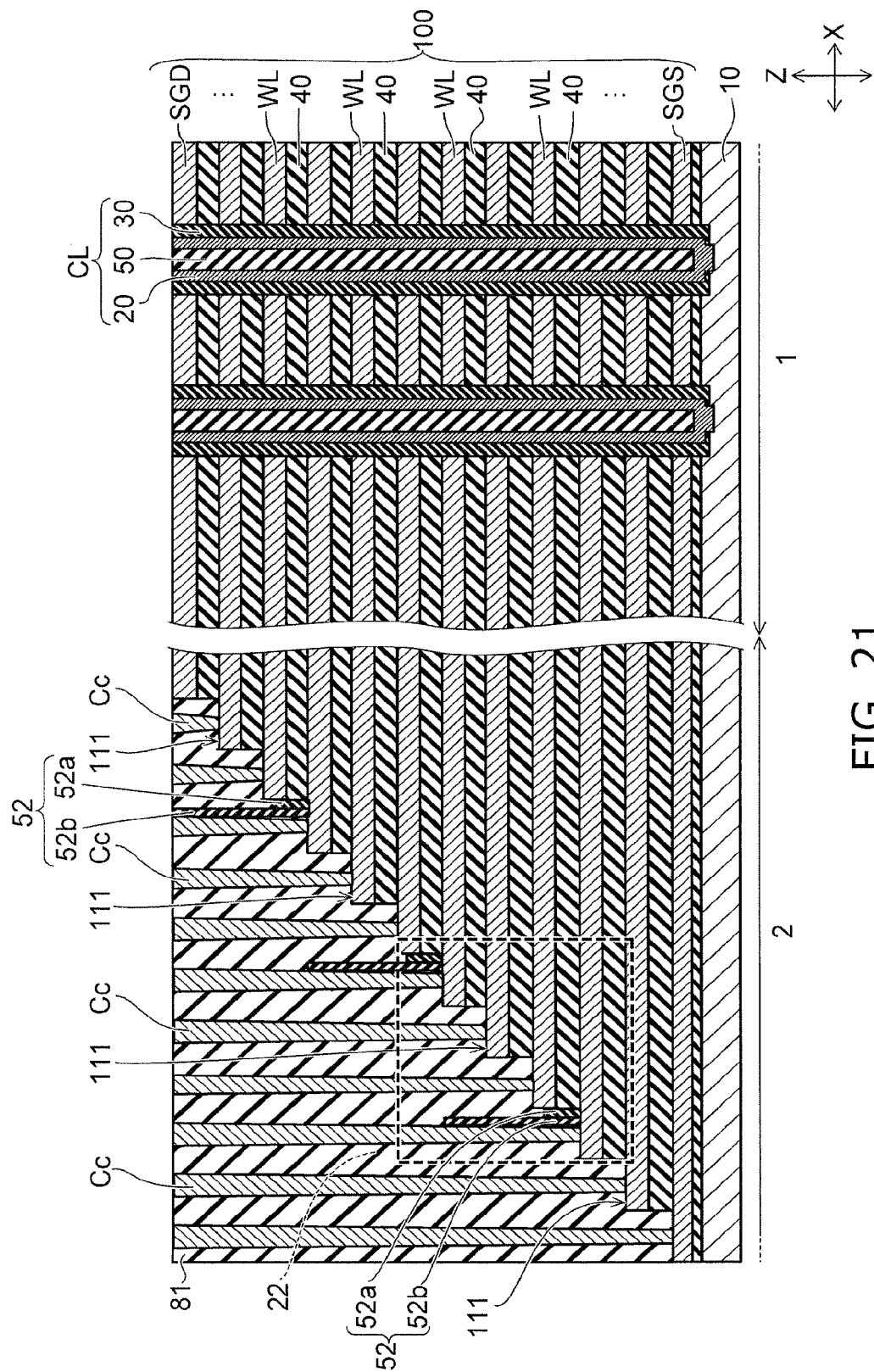
FIG. 21 is a schematic cross-sectional view of a semiconductor device of a third embodiment.
Figure 22:
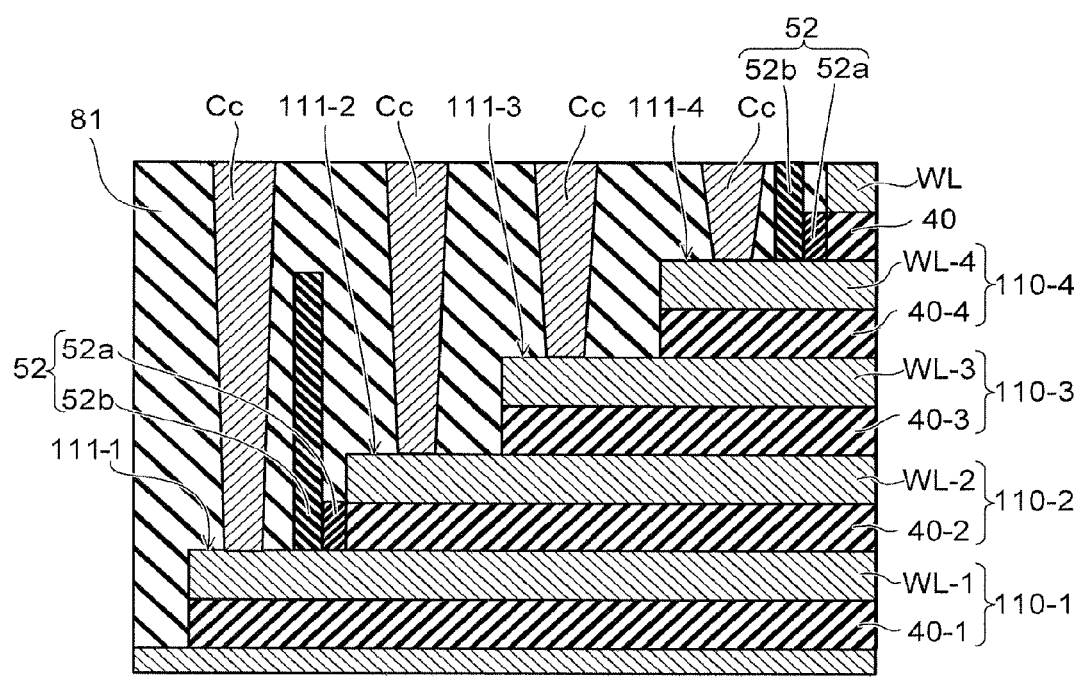
FIG. 22 is an enlarged schematic cross-sectional view of a broken line 22 in FIG. 21.

FIG. 21 is a schematic cross-sectional view of a semiconductor device of a third embodiment. The schematic cross-sectional view shown in FIG. 21 corresponds to the cross-sectional view shown in FIG. 3. FIG. 22 is an enlarged schematic cross-sectional view of a broken line frame 22 if FIG. 21.

As shown in FIG. 21 and FIG. 22, the semiconductor device of the third embodiment is common with the semiconductor device of the second embodiment in a point of the side wall film 52 including the first film 52a and the second film 52b. The semiconductor device of the third embodiment is different from the semiconductor device of the second embodiment in the insulator 40 being not provided on the terrace 111. That is, the contact portion Cc is directly connected to the terrace 111 of a contact region to the electrode layers (SGD, WL, SGS) without connecting to the insulator 40.

In the third embodiment, the respective electrode layers WL-1 to WL-4 of the respective structure bodies 110-1 to 110-4 are provided on the respective insulators 40-1 to 40-4. Therefore, the side wall film 52 contacts the terrace 111.

Also in the third embodiment, the side wall film 52 including the first film 52a and the second film 52b is provided on the terrace 111 across the adjacent two terraces 111. For this reason, in the process of processing the insulator 40 in a step-wise, the side wall film 52 is possible to be processed simultaneously with a separated portion of the insulator 40. For this reason, for example, compared with the method for forming the step structure by processing the insulator 40 one layer by one layer, the number of processes can be reduced.

Third Embodiment: Manufacturing Method

Next, a method for manufacturing the semiconductor device of the third embodiment will be described.

Figure 23A:
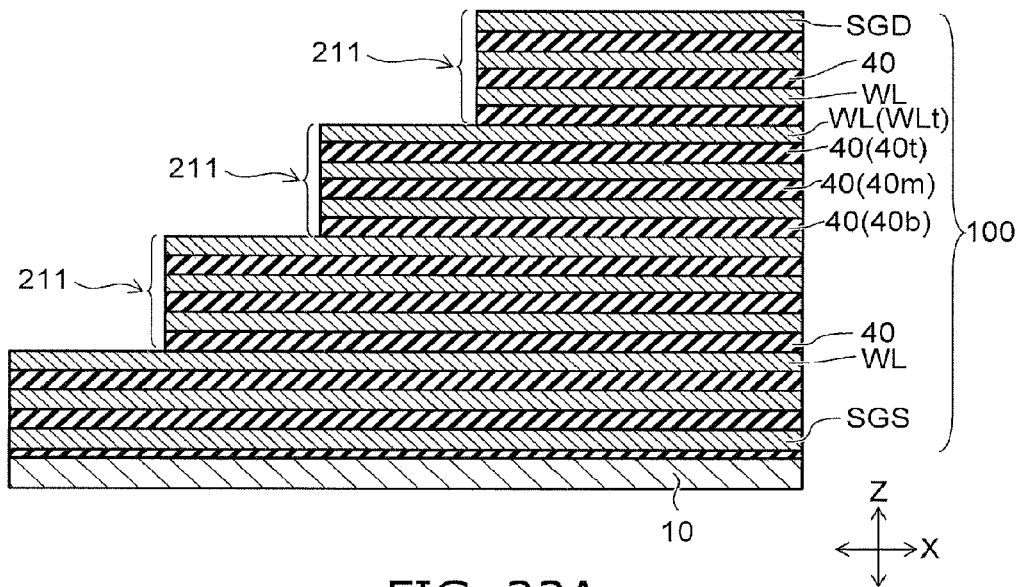
FIG. 23A to FIG. 24 are schematic cross-sectional views showing a method for manufacturing a semiconductor device of a third embodiment.
Figure 23B:
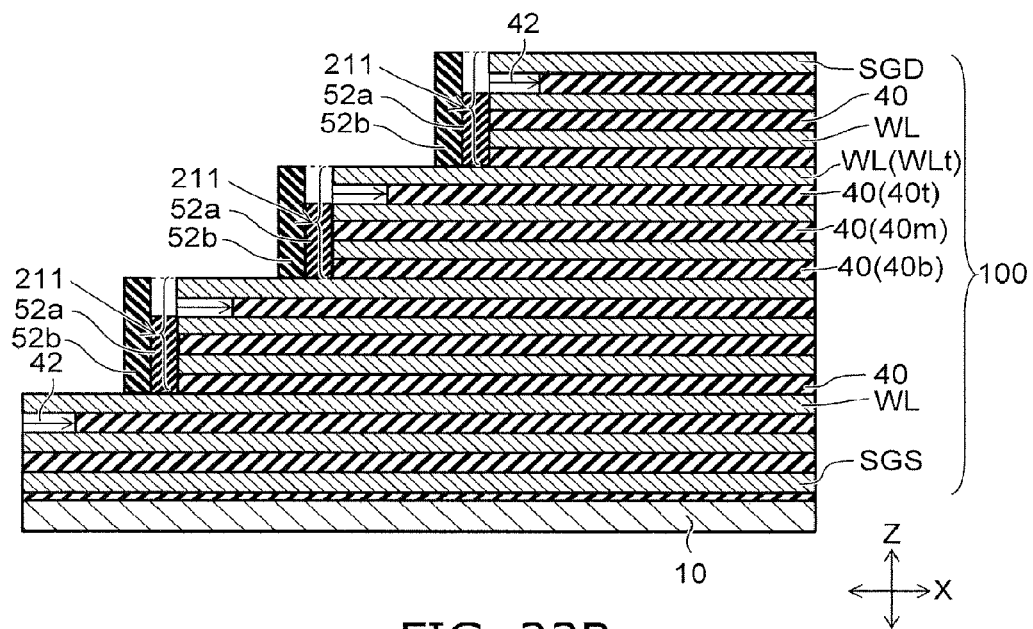
Figure 24:
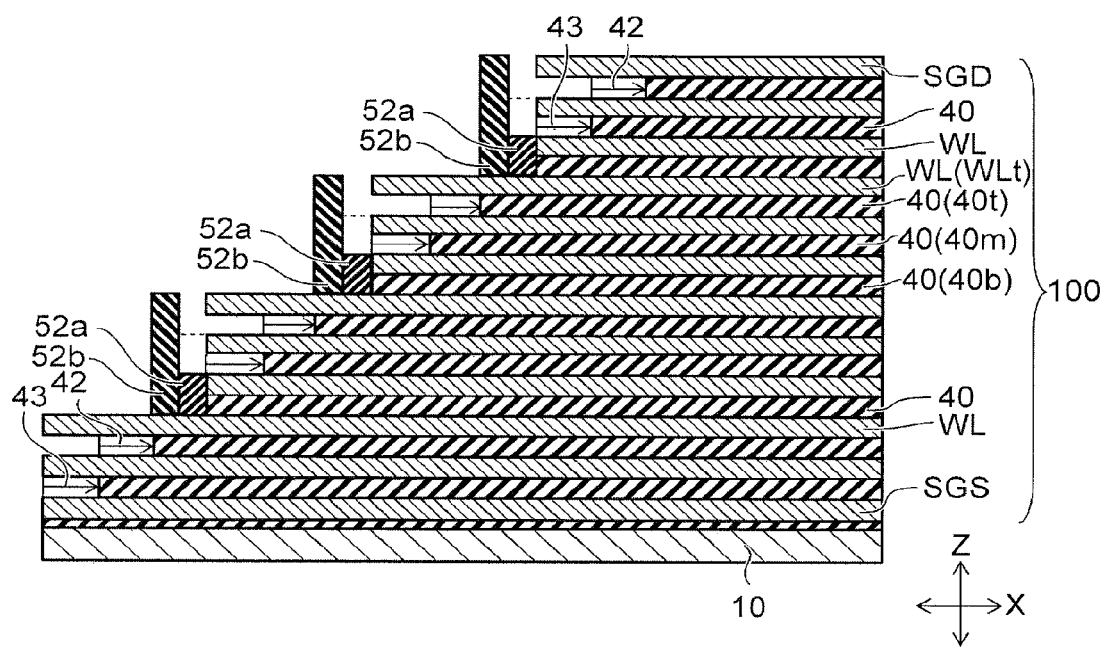

FIG. 23A to FIG. 24 are schematic views showing the method for manufacturing the semiconductor device of the third embodiment.

As shown in FIG. 23A to FIG. 24, the method for manufacturing the semiconductor device of the third embodiment is different from the method for manufacturing the semiconductor device of the second embodiment in forming the stacked body 100 alternately stacked with the electrode layers (SGD, WL, SGS) and the insulator 40, and in removing at one time the portion of the electrode layers (SGD, WL, SGS) separated from the insulator 40 after removing the insulator 40 exposed from the step 211.

<Forming Stacked Body 100, Process of Forming Step>

For example, in accordance with the manufacturing method described with reference to FIG. 5A to FIG. 6B, The structure shown in FIG. 23A is obtained. In the third embodiment, the stacked body 100 is in a state where the electrode layers (SGD, WL, SGS) and the insulator 40 are alternately stacked. Materials of the electrode layers (SGD, WL, SGS) are conductive and materials that can take an etching selection ratio to the insulator 40. For example, when a silicon oxidation film is selected as the insulator 40, a metal member such as tungsten or the like is selected as the material of the electrode layers (SGD, WL, SGS). In the third embodiment, the upper surfaces of the electrode layers (SGD, WL, SGS) formed on the uppermost layer of the steps 211 are exposed from the stacked body 100. Here, the insulators 40 exposed from one step 211 are taken as the first insulator 40t, the second insulator 40m and the third insulator 40b in order from the top.

<Forming Side Wall Film 52, Forming Step-Wise Insulator>

Next, for example, in accordance with the manufacturing method described with reference to FIG. 17A to FIG. 18B, the first film 52a and the second film 52b shown in FIG. 23B are formed. The selection condition of the materials of the first film 52a and the second film 52b is the same as the second embodiment.

After that, the first film 52a is retreated. Thereby, the side surface of the first insulator 40t and a side surface of the first electrode layer WLt are separated from the first film 52a, and are exposed from the step 211. Thereafter, the side surface of the insulator 40 exposed from the step 211 is retreated. Thereby, the space 42 is formed in the retreated portion of the first insulator 40t.

Next, as shown in FIG. 24, the first film 52a is retreated, and the insulator 40 exposed from the step 211 is retreated. At this time, the space 42 is expanded by further retreating the first insulator 40t. The space 43 is formed in the retreated portion of the second insulator 40m. That is, similar to the first embodiment and the second embodiment described above, only the insulators 40 exposed from the respective steps 211 of the plurality of insulators 40 can be retreated at one time. For this reason, in the process of forming the insulator 40 in a step-wise, the number of processes can be reduced. For this reason, also in the case where the number of stacking of the stacked body 100 is increased, it is possible to suppress the number of processes of forming the step section from increasing.

In the case where the material of the insulator 40 (for example, silicon oxide substance) is selected as the first film 52a, similar to the first embodiment described above, retreating of the insulator 40 and retreating of the first film 52a may be performed simultaneously. With respect to the detail, for example, see FIG. 13A and FIG. 13B.

<Processing Electrode Layers (SGD, WL, SGS) in a Step-Wise to Forming Contact Portion Cc>

After that, for example, the semiconductor device of the third embodiment is formed by the similar process (except replacement process) to the first embodiment and the second embodiment described above. With respect to the detail, see FIG. 9A and FIG. 10B.

Fourth Embodiment: Semiconductor Device

Figure 25:
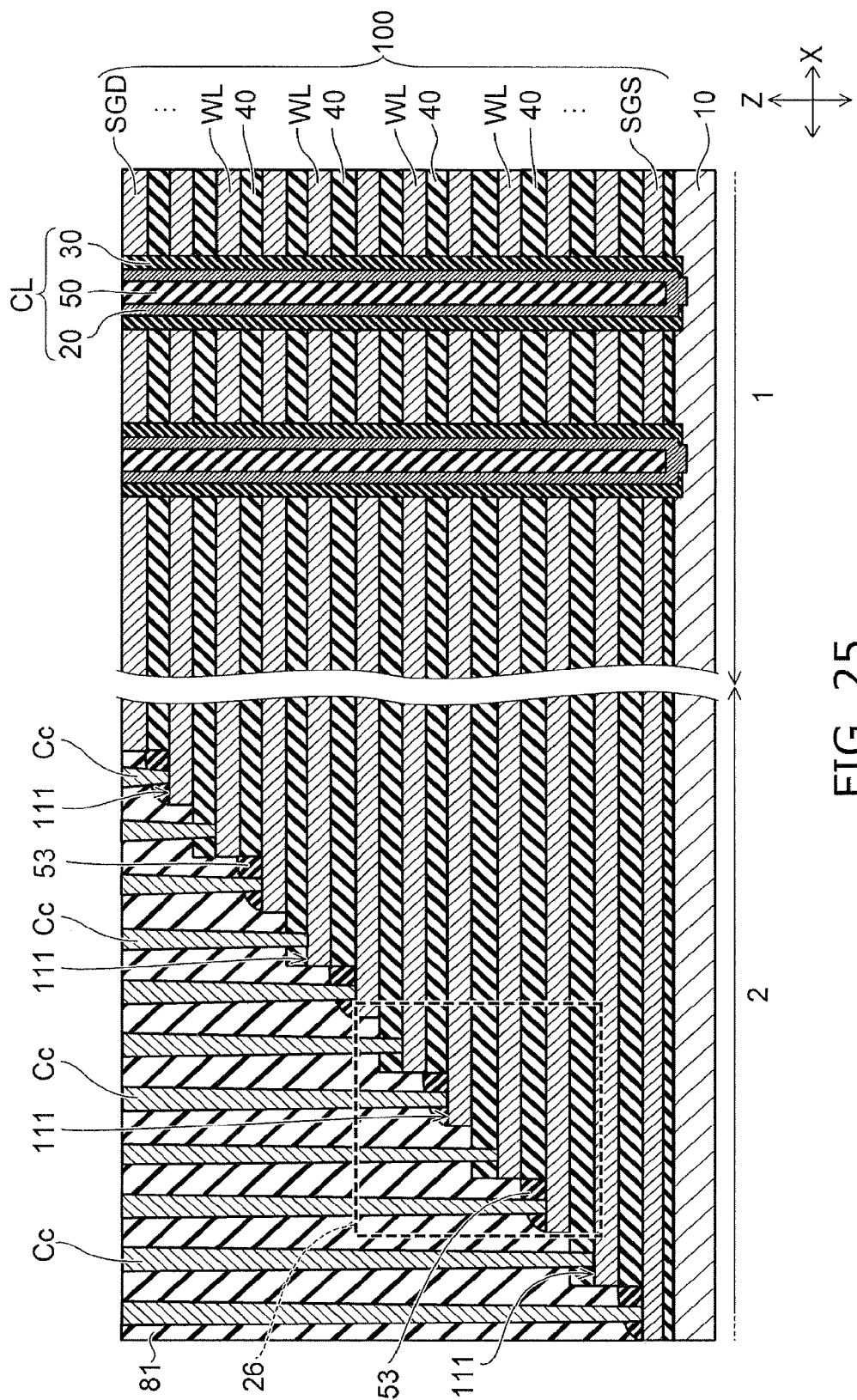
FIG. 25 is a schematic cross-sectional view of a semiconductor device of a fourth embodiment.
Figure 26:
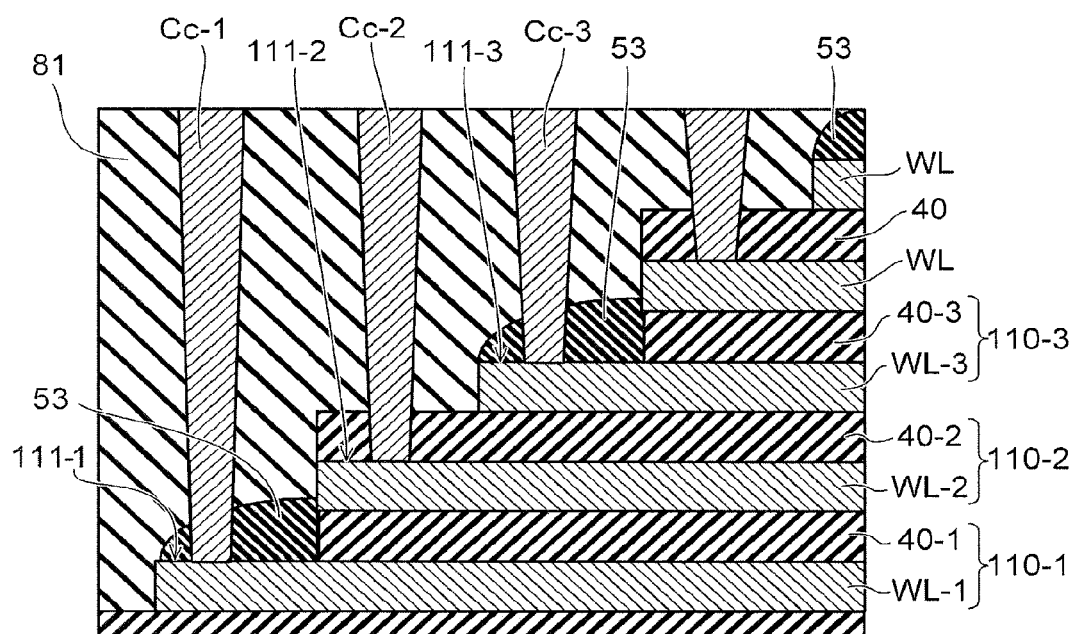
FIG. 26 is an enlarged schematic cross-sectional view of a broken line 26 in FIG. 25.

FIG. 25 is a schematic cross-sectional view of a semiconductor device of the fourth embodiment. The cross-sectional view shown in FIG. 25 corresponds to the cross-sectional view shown in FIG. 3. FIG. 26 is an enlarged schematic cross-sectional view of a broken line frame 26 in FIG. 25.

As shown in FIG. 25 and FIG. 26, the semiconductor device of the fourth embodiment is different from the semiconductor device of the first embodiment in that one of a side wall film 53 and the insulator 40 is provided on the terrace 111 and the insulator 40 is provided in a step-wise of every two layers. In the fourth embodiment, the side wall film 53 may include, for example, a silicon oxide having the same composition as the insulator 40.

In the fourth embodiment, the side wall film 53 contacts the terrace 111 of the electrode layers (SGD, WL, SGS). That is, the insulator 40-1 is provided on the first electrode layer WL-1 except the first terrace 111-1. The side wall film 53 contacts the first terrace 111-1 and the side surface of the first insulator 40-1. A first contact portion Cc-1 contacts the first electrode layer WL-1 through the side wall film 53.

The third insulator 40-3 is provided on the third electrode layer WL-3 except the third terrace 111-3. The side wall film 53 contacts the third terrace 111-3 and the side surface of the third insulator 40-3. A third contact portion Cc-3 contacts the third electrode layer WL-3 through the side wall film 53.

The second insulator 40-2 is provided on the second electrode layer WL-2 except the second terrace 111-2. An upper surface of the second insulator 40-2 is separated from the side wall film 53. A second contact portion Cc-2 contacts the second electrode layer WL-2 through the second insulator 40-2 and is separated from the side wall film 53.

Also in the fourth embodiment, the side wall film 53 is provided on the terrace 111 across one terrace 111. For this reason, in the process of processing the replacement member 41 in a step-wise, it is possible to process simultaneously the partial replacement member 41 separated from the side wall film 53. Thereby, for example, compared with the process of forming the step structure by processing the replacement member 41 one layer by one layer, the number of processes can be reduced.

Fourth Embodiment: Terrace 111

Next, an example of a width of the terrace 111 in the semiconductor device of the fourth embodiment will be described.

Figure 27A:
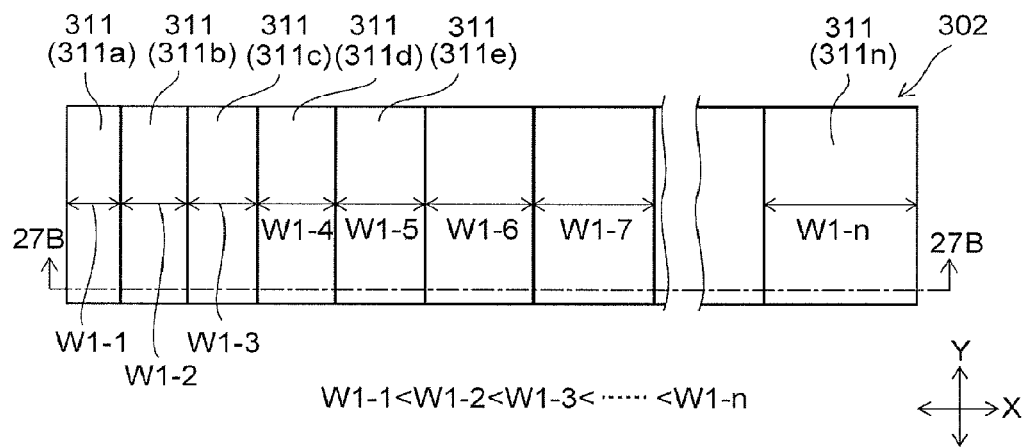
FIG. 27A is a schematic plan view of a semiconductor device of a comparative example.
Figure 27B:
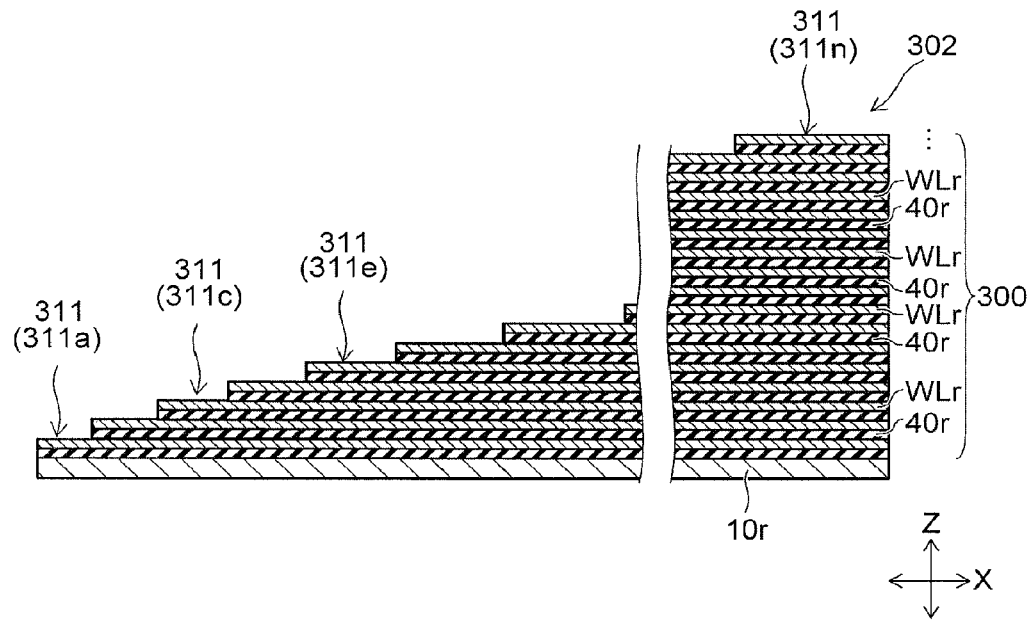
FIG. 27B is a schematic cross-sectional view along a 27B-27B line in FIG. 27A.
Figure 28A:
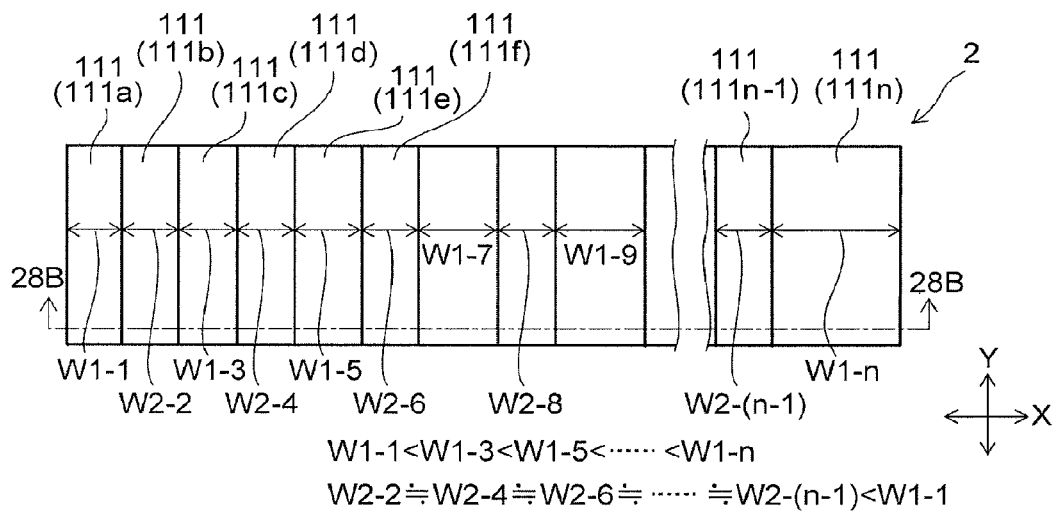
FIG. 28A is a schematic plan view of the semiconductor device of the fourth embodiment.

FIG. 27A is a schematic plan view of a step structure section 302 of a semiconductor device of a comparative example. FIG. 27B is a schematic cross-sectional view along a 27B-27B line if FIG. 27A. FIG. 28A is a schematic plan view of the step structure section 2 of the semiconductor device of the fourth embodiment. FIG. 28 is a schematic cross-sectional view along a 28B-28B line in FIG. 28A.

As shown in FIG. 27A and FIG. 27B, respective terraces 311 formed in a step-wise have different widths (W1-1, W1-2, W1-3, . . . , W1-n: n shows stratum) depending on an stratum ordinarily. That is, in the case where the terraces 311 are formed by etching the replacement member 41 and the insulator 40 one layer by one layer, widths of the respective terraces 311 increase with going from a lower layer to an upper layer (W1-1<W1-2<W1-3< . . . <W1-n).

The reason why the terraces 311 having different widths depending on the stratum includes, for example, process fluctuation in the step forming process. The step formation is made ordinarily by using a photoresist as a mask and while slimming (width reduction) the photoresist processing a foundation material. The process fluctuation in slimming of the photoresist influences the width of the terrace 311. Since the fluctuation of the step forming process per one step is integrated with increasing the step number of the step forming process, in order to ensure a margin for absorbing the fluctuation, the width of the terrace 311 must be increased with going from a lower portion of the steps to an upper portion. This is because of the possibility of generating breaking (open failure) or short circuit (short failure) due to positional shift of the contact portion when forming the contact portion in the step structure section 302. However, the width of the terrace 311 is increased with going from the lower layer to the upper layer, the width of the step structure section 302 in the X-direction increases and disturbs reduction of the device.

Figure 28B:
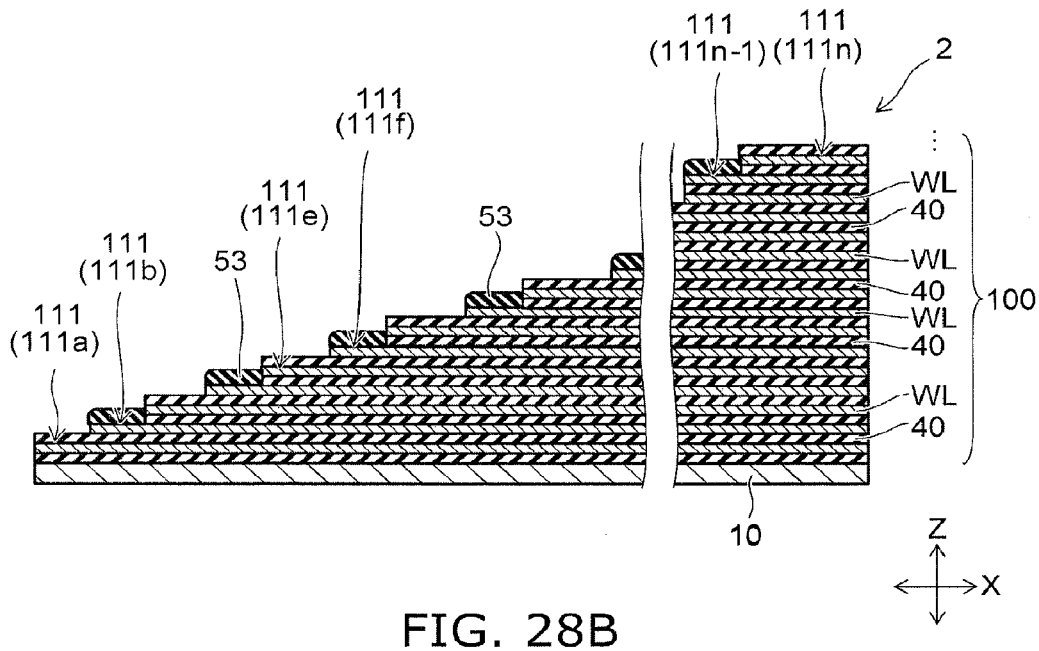
FIG. 28B is a schematic cross-sectional view along a 28B-28B line in FIG. 28A.

On the other hand, in the fourth embodiment, as shown in FIG. 28A and FIG. 28B, the terraces 111 include terraces (111a, 111c, 111e, . . . , 111n) having different widths (W1-1, W1-3, W1-5, . . . , W1-n in the X-direction) depending on the stratum and terraces (111b, 111d, 111f, . . . , 111n-1) having a nearly uniform width (W2-2, W2-4, W2-6, . . . , W2-(n-1). The terraces (111a, 111c, 111e, . . . , 111n) and the terraces (111b, 111d, 111f, . . . , 111n-1) are alternately stacked along the X-direction. The side wall films 53 are provided on the terraces (111b, 111d, 111f, . . . , 111n-1). This disposition allows the width of the step structure section 2 to be smaller than the width of the step structure section 302 of the comparative example. The width difference between the step structure section 2 and the step structure section 302 will be described by using FIG. 29.

Figure 29:
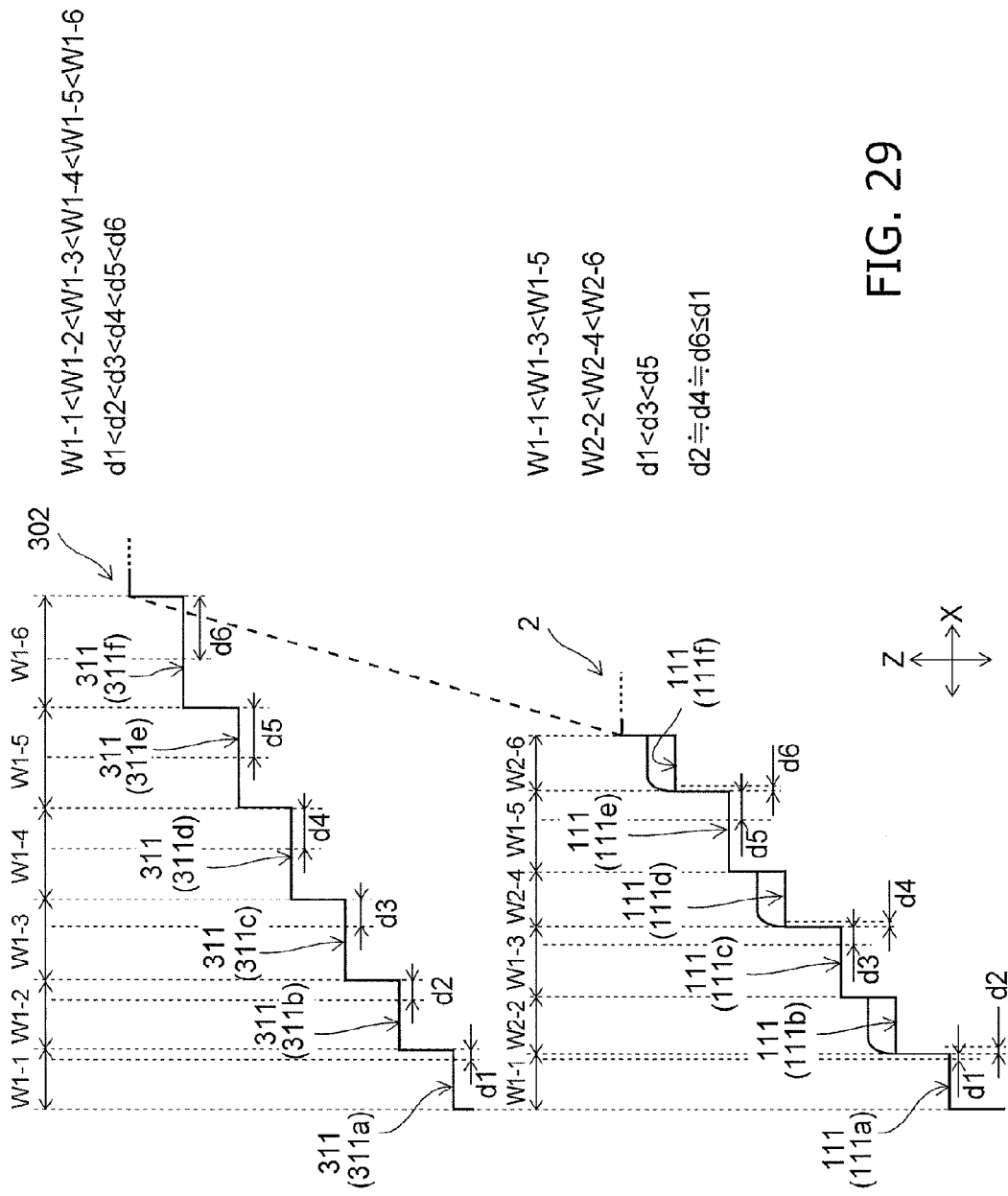
FIG. 29 is a an enlarged schematic cross-sectional view of a part of a step structure section of the fourth embodiment.

FIG. 29 is an enlarged schematic cross-sectional view of a part of the step structure section 2 (lower side) of the fourth embodiment and the step structure section 302 (upper side) of the comparative example. FIG. 29 shows the respective terraces 111, 311 of the first to sixth layer of the respective step structure sections 2, 302.

As shown in FIG. 29, respective widths d1, d3, d5 of the step structure section 2 and respective widths d1 to d6 of the step structure section 302 show enlarged widths of the respective terraces 111, 311 due to the step forming process including slimming. The widths are integrated with increasing number of times of the step forming process, and increase with going from the lower layer to the upper layer. Here, in the fourth embodiment, two layers of the replacement member 41 and two layers of the insulator 40 are etched by one time slimming in the step forming process. For this reason, in the fourth embodiment, the number of times of the step forming process is small compared with the step structure section 302 of the comparative example. Therefore, total width of the respective widths d1, d3, d5 of the step structure section 2 is smaller than total width of the respective widths d1 to d6 of the step structure section 302. The widths d2, d4, d6 of the step structure section 2 show enlarged widths of the respective terraces 111 due to the forming process of the side wall film 53. The widths d2, d4, d6 are constant not depending on the stratum, and for example, not more than the width d1.

Therefore, in the fourth embodiment, the enlargement of the width of the terrace 111 accompanying with performing of the step forming process can be suppressed, and the width of the step structure section 2 in the X-direction can be shortened. Thereby, reduction of the device can be made.

Figure 30A:
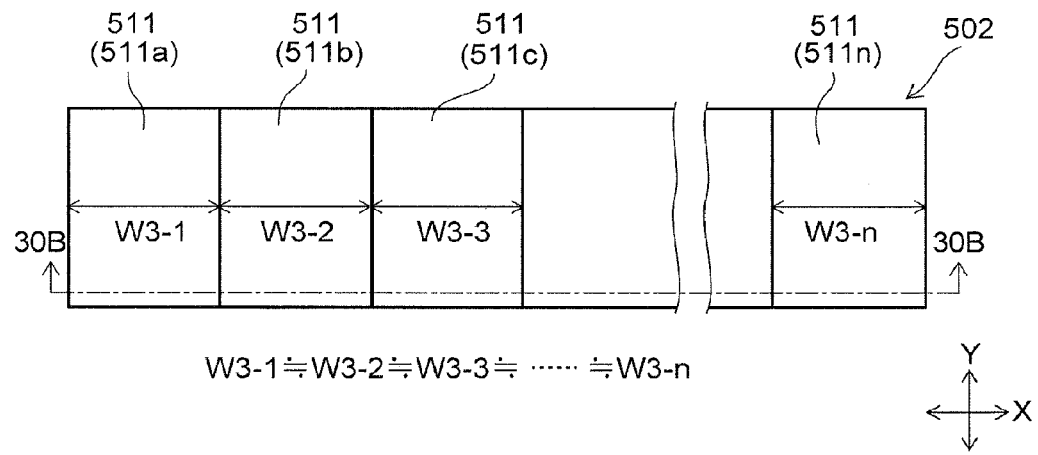
FIG. 30A is a schematic plan view of a semiconductor device of other comparative example.
Figure 30B:
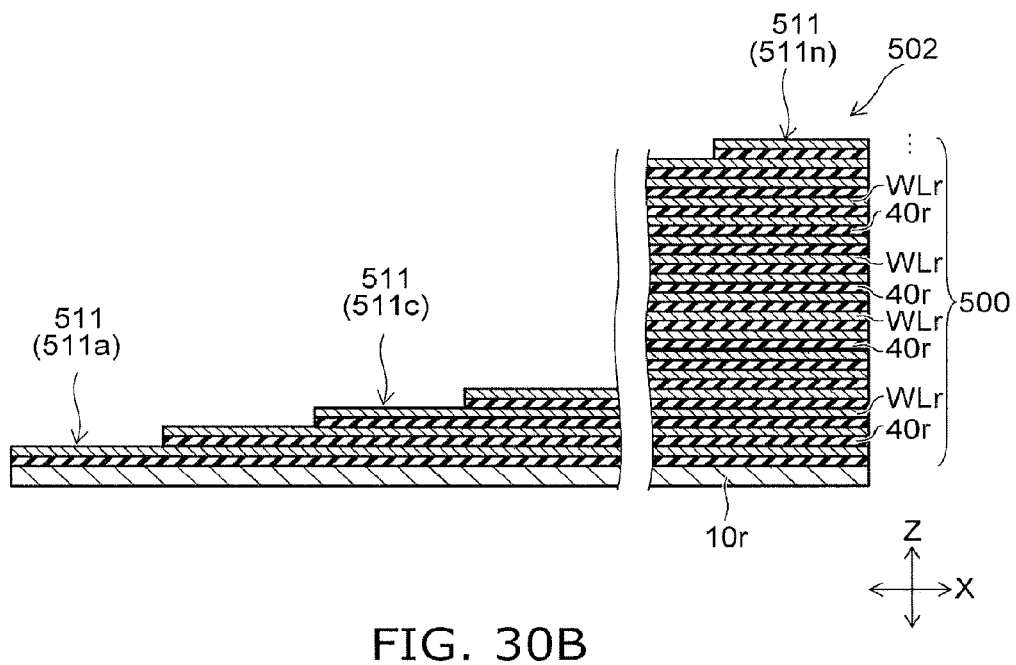
FIG. 30B is a schematic cross-sectional view along a 30B-30B line in FIG. 30A.
Figure 31A:
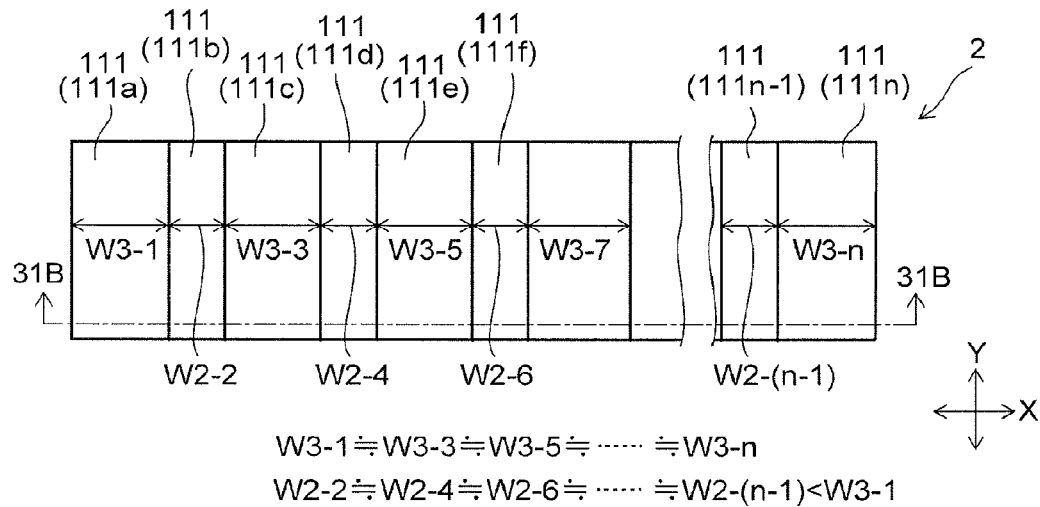
FIG. 31A is a schematic plan view of the semiconductor device of the fourth embodiment.
Figure 31B:
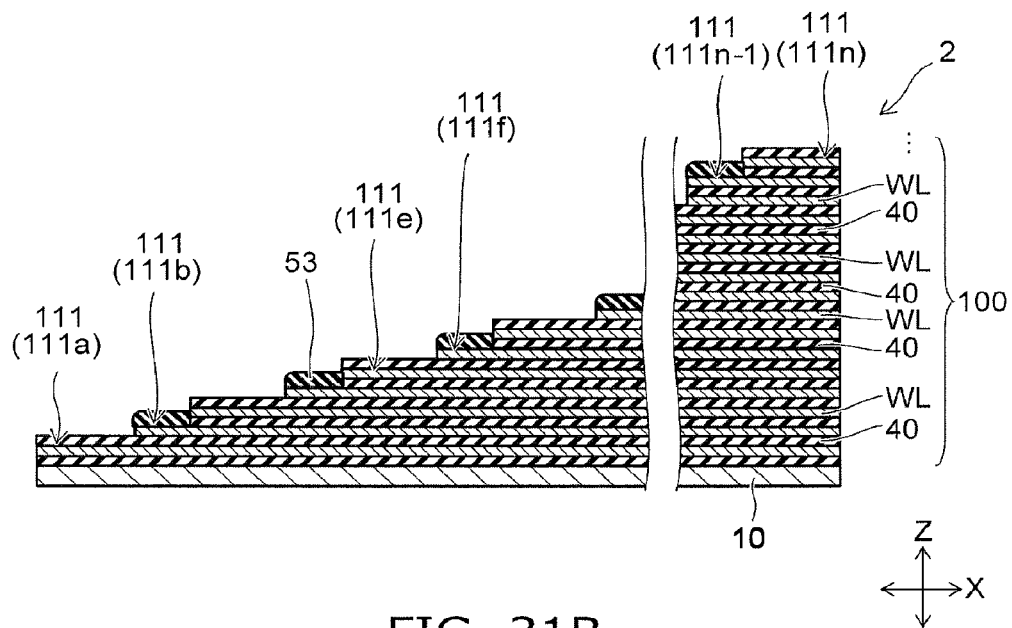
FIG. 31B is a schematic cross-sectional view along a 31B-31B line in FIG. 31A.

FIG. 30A is a schematic plan view of a step structure section 502 of a semiconductor device of other comparative example. FIG. 30B is a schematic cross-sectional view along a 30B-30B line in FIG. 30A. FIG. 31A is a schematic plan view of the step structure section 2 of the semiconductor device of the fourth embodiment. FIG. 31B is a schematic cross-sectional view along a 31B-31B line in FIG. 31A.

As shown in FIG. 30A and FIG. 30B, respective terraces 511a to 511n formed in a step-wise have a nearly uniform width (W3-1, W3-2, W3-3, . . . , W3-n). The respective terraces 511 are formed in the step forming process in response to the width W3-n of the terrace 511n formed on the uppermost layer. However, since the widths of the respective terraces 511 are formed to be large, the width of the step structure section 502 in the X-direction becomes large, and reduction of the device is disturbed.

On the other hand, in the fourth embodiment, as shown in FIG. 31A and FIG. 31B, the terraces 111 alternately dispose terraces (111a, 111c, 111e, . . . , 111n) having a nearly uniform first width (W3-1, W3-3, W3-5, . . . , W3-n) and terraces (111b, 111d, 111f, . . . , 111n-1) having a nearly uniform second width (W2-2, W2-4, W2-6, . . . , W2-(n-1)) in the X-direction, the second width being shorter than the first width. This disposition allows the width of the step structure section 2 in the X-direction to be smaller than the width of the step structure section 502. Therefore, in the fourth embodiment, the enlargement of the width of the terrace 111 accompanying with performing of the step forming process can be suppressed, and the width of the step structure section 2 in the X-direction can be formed to be short. Thereby, reduction of the device can be made.

Fourth Embodiment: Manufacturing Method

Next, a method for manufacturing the semiconductor device of the fourth embodiment will be described.

FIG. 32a to FIG. 33B are schematic cross-sectional views showing the method for manufacturing the semiconductor device of the fourth embodiment.

<Forming Stacked Body 100 to Forming Side Wall Film 52>

Figure 32A:
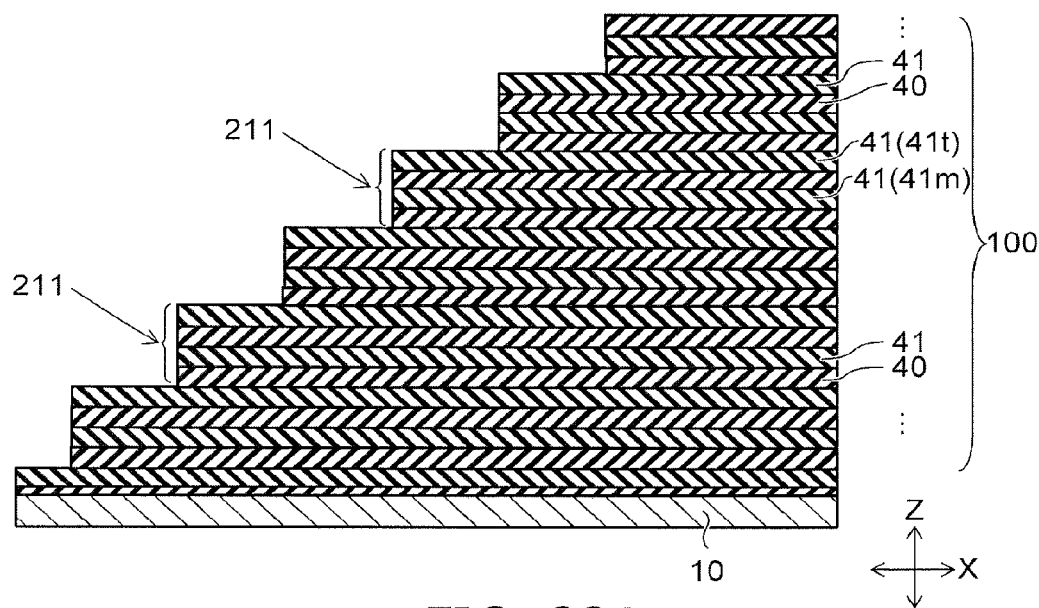
FIG. 32A to FIG. 33B are schematic cross-sectional views showing a method for manufacturing the semiconductor device of the fourth embodiment.

For example, according to the manufacturing method with reference of FIG. 5A to FIG. 6B, the structure shown in FIG. 32A is obtained. In the fourth embodiment, the step 211 includes two layers of the replacement member 41 and two layers of the insulator 40. The side surfaces of the two layers of the replacement member 41 and the side surfaces of the two layers of the insulator 40 are exposed from the respective steps 211. The upper surface of the replacement member 41 formed on the uppermost layer of the respective steps 211 is exposed from the stacked body 100. Here, the replacement members 41 exposed from one step 211 is taken as the first replacement member 41t and the second replacement member 41m in order from the top.

<Forming Side Wall Film 53>

Figure 32B:
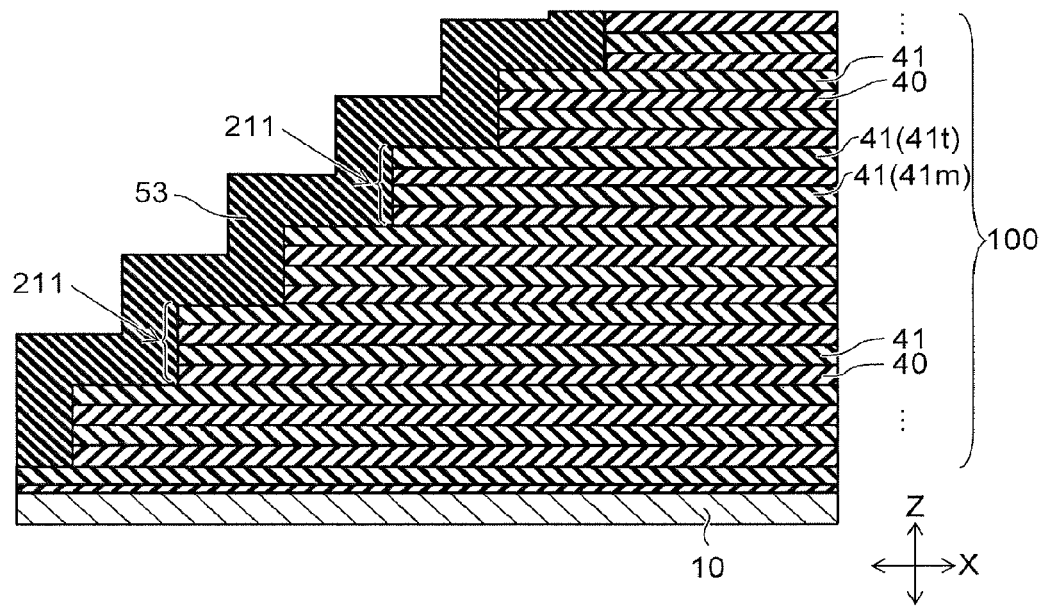

Next, as shown in FIG. 32B, the side wall film 53 is formed to be conformal on the stacked body 100. For example, a silicon oxide is selected as the side wall film 53.

Figure 33A:
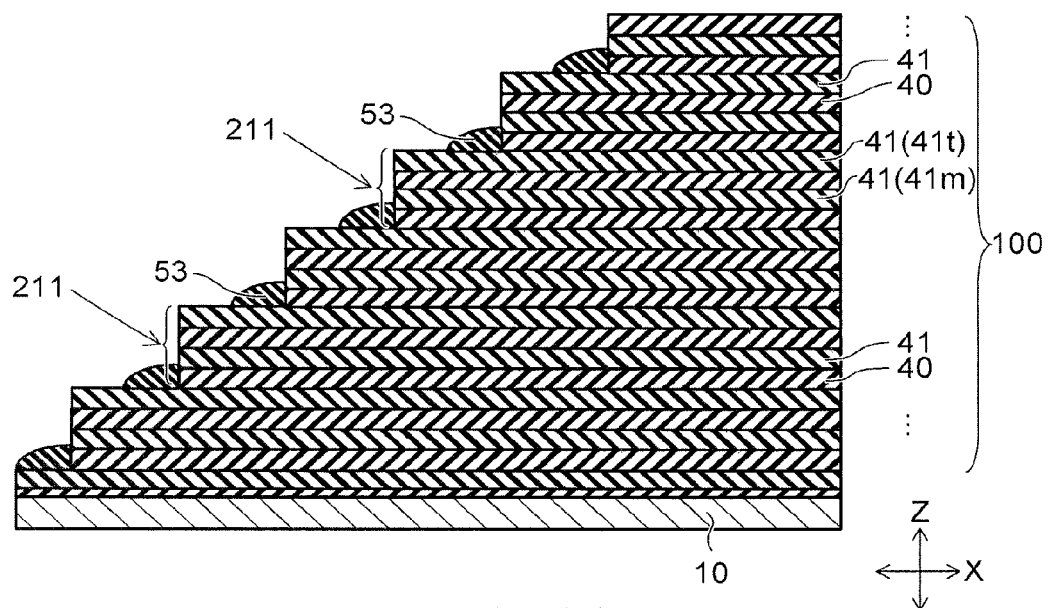

Next, as shown in FIG. 33A, the side wall film 53 of the portion separated from the step 211 is removed. Thereby, the respectively separated plurality of side wall films 53 is formed. As the method for removing the side wall films 53, for example, anisotropic etching such as the RIE method or the like is used. At this time, a portion of the upper surface of the first replacement member 41t is separated from the side wall film 53 and exposed from the stacked body 100. Here, fluctuation of removal amount of the side wall film 53 is smaller than removal amount of the replacement member 41 in the step forming process. Therefore, areas of the side wall films 53 contacting the upper surface of the first replacement member 41t are nearly equal regardless of the stratum.

<Processing Replacement Member 41 in a Step-Wise>

Figure 33B:
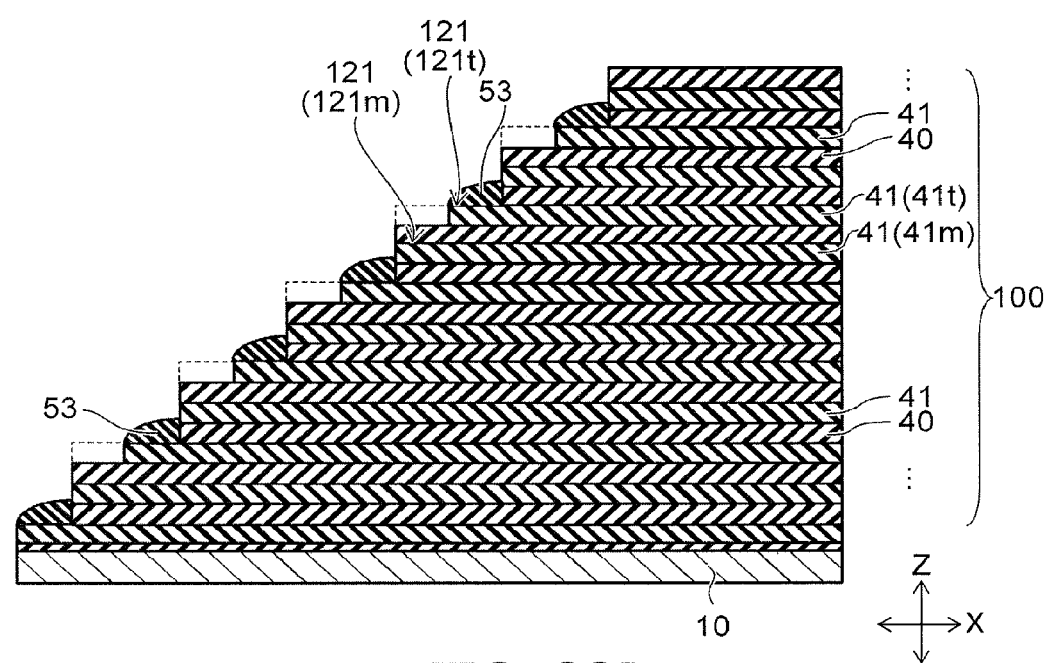

Next, as shown in FIG. 33B, the first replacement member 41 exposed from the stacked body 100 is removed. The broken line portion in the drawing shows a position of the surface of the first replacement member 41t before the removal. As the method for removing the first replacement member 41t, for example, anisotropic etching such as the RIE method or the like using the side wall film 53 as a mask is used. At this time, the second replacement member 41m is protected by the insulator 40 or the side wall film 53 and not removed. Thereby, the end portions of the respective replacement members 41 are processed in a step-wise, and the terraces 121 are formed on the upper surfaces of the end portions of the respective replacement members 41. The upper surface of the insulator 40 is exposed at a portion of the first replacement member 41t removed. On the terrace 121, a terrace 121t contacting the side wall film 53 and a terrace 121m contacting the insulator 40 are alternately disposed.

Here, the respective terraces 121 correspond to the respective terraces 111 when the semiconductor device is formed. For example, in the case where the respective terraces 121 correspond to the respective terraces 111 shown in FIG. 28A and FIG. 28B, the widths of the terraces 121t contacting the side wall film 53 are nearly uniform regardless of the stratum, and the widths of the terraces 121m contacting the insulator 40 increase with being disposed from the lower layer to the upper layer. In the case where the respective terraces 121 correspond to the respective terraces 111 shown in FIG. 31a and FIG. 31B, the widths of the terraces 121 are also nearly uniform regardless of the stratum, however the widths of the terraces 121m always become wide to the widths of the terraces 121t.

<Forming Insulating Layer 81 to Forming Contact Portion Cc>

After that, for example, in the first embodiment, the semiconductor device of the fourth embodiment is formed by the same process as the process described with reference to FIG. 9B to FIG. 12.

According to the fourth embodiment, similar to the first embodiment described above, the replacement member 41 not covered with the side wall film 53 of the plurality of replacement members 41 can be selectively removed. For this reason, in the process of processing the replacement member 41 in a step-wise, the number of processes can be reduced.

As described above, according to the embodiments, the number of processes when forming the step structure section 2 can be reduced. Thereby, also in the case where the number of stacking the stacked body 100 increases, it is possible to suppress increase of the number of processes forming the step structure section 2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device comprising:
a stacked body including a first structure body and a second structure body;
the first structure body including
a first electrode layer having a first terrace on an upper surface of the first electrode layer, and
a first insulator provided on the first electrode layer,
the second structure body provided on the first structure body except on the first terrace, the second structure body including a second electrode layer having a second terrace on an upper surface of the second electrode layer, and a second insulator provided on the second electrode layer; and a first side wall film provided on the first terrace and separated from an upper surface of the second structure body, wherein a first distance between an upper end of the first side wall film and the first structure body is equal to or shorter than a second distance between the upper surface of the second structure body and the first structure body.

2. The semiconductor device according to claim 1, wherein the first side wall film contacts a side surface of the second structure body.

3. The semiconductor device according to claim 1, further comprising:

a second side wall film separated from the first side wall film and the second structure body, the stacked body including a third structure body provided on the second structure body except on the second terrace, the third structure body including a third electrode layer having a third terrace on an upper surface of the third electrode layer, and a third insulator provided on the third electrode layer, and the second side wall film provided on the third terrace and contacting the third structure body.

4. The semiconductor device according to claim 1, wherein the first side wall film includes a first film contacting a side surface of the second structure body, and a second film separated from the second structure body and having an etching rate less than an etching rate of the first film, the first film provided between the second film and the second structure body, and a thickness of the second film along a stacking direction of the stacked body is thicker than a thickness of the first film.

5. The semiconductor device according to claim 1, further comprising:

an insulating layer provided integrally on the first structure body and the second structure body; and a first contact portion and a second contact portion provided in the insulating layer and extending in a stacking direction of the stacked body, the first contract portion contacting the first side wall film and the first electrode layer, the first contact portion separated from the second electrode layer, and the second contact portion contacting the second electrode layer, the second contact portion separated from the first electrode layer and the first side wall film.

6. The semiconductor device according to claim 1, further comprising:

a semiconductor body provided in the stacked body and extending in a stacking direction of the stacked body, the semiconductor body separated from the first terrace and the second terrace; and a charge storage film provided between the semiconductor body and the first electrode layer and between the semiconductor body and the second electrode layer.

* * * * *